(12) United States Patent
Ohshima et al.

(10) Patent No.: US 7,739,634 B2
(45) Date of Patent: Jun. 15, 2010

(54) VERIFICATION EQUIPMENT OF SEMICONDUCTOR INTEGRATED CIRCUIT, METHOD OF VERIFYING SEMICONDUCTOR INTEGRATED CIRCUIT AND PROCESS OF MANUFACTURE OF SEMICONDUCTOR DEVICE

(75) Inventors: Shigeo Ohshima, Kawasaki (JP); Kiminobu Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 448 days.

(21) Appl. No.: 11/742,287

(22) Filed: Apr. 30, 2007

(65) Prior Publication Data
US 2007/0283303 A1    Dec. 6, 2007

(30) Foreign Application Priority Data
May 1, 2006    (JP)    .............................. 2006-127540

(51) Int. Cl.
    *G06F 17/50*    (2006.01)
(52) U.S. Cl. ....................... 716/5; 716/4; 716/6; 716/18
(58) Field of Classification Search ...................... 716/4, 716/6, 18
    See application file for complete search history.

(56) References Cited

U.S. PATENT DOCUMENTS 5,530,394 A * 6/1996 Blossfeld et al. ............ 327/530

7,409,328 B1 * 8/2008 McGaughy et al. ........... 703/14

FOREIGN PATENT DOCUMENTS

| JP | 5-74948 | 3/1993 |
|----|---------|--------|
| JP | 2000-293555 | 10/2000 |

* cited by examiner

*Primary Examiner*—Thuan Do
(74) *Attorney, Agent, or Firm*—Oblon, Spivak, McClelland, Maier & Neustadt, L.L.P.

(57) ABSTRACT

The verification equipment of a semiconductor integrated circuit in the present invention is included with a circuit net list extraction section that extracts the net list of a circuit, a circuit simulation execution section that executes a circuit simulation, based on the extracted net list, a finite impedance judgment section that judges existence or nonexistence of finite impedances, a floating error terminal judgment section that judges existence or nonexistence of floating error terminals by measuring finite impedances, a true floating error terminal judgment section that adds any one of a P channel-type transistor and an N channel-type transistor to terminals of the circuit where it is judged that there are floating error terminals and calculates changes in potential at the terminals and adds the other of the P channel-type transistor and the N channel-type transistor to the terminals and calculates changes in potential at the terminals, and an output section that outputs a judgment result of the floating error terminal judgment section and a judgment result of the true floating error terminal judgment section.

20 Claims, 24 Drawing Sheets

VERIFICATION EQUIPMENT OF SEMICONDUCTOR INTEGRATED CIRCUIT, METHOD OF VERIFYING SEMICONDUCTOR INTEGRATED CIRCUIT AND PROCESS OF MANUFACTURE OF SEMICONDUCTOR DEVICE

CROSS-REFERENCE TO RELATED APPLICATIONS

This application is based upon and claims the benefit of priority from the prior Japanese Patent Applications No. 2006-127540, filed on May 1, 2006, the entire contents of which are incorporated herein by reference.

TECHNICAL FIELD

The present invention relates to verification equipment, a method of verifying a semiconductor integrated circuit, and a process of manufacture of a semiconductor device in verifying a connection of the semiconductor integrated circuit.

BACKGROUND OF THE INVENTION

In a design stage of the semiconductor integrated circuit, whether or not all terminals are definitely connected to fixed potentials, i.e., a power supply potential (VDD), an earth potential (VSS) or internal potentials that are a plurality of internal potentials generated inside the integrated circuit are verified (hereinafter referred to as "floating check").

In the floating check, after a net list showing the connection state of a logic circuit from a logic circuit diagram prepared by a CAD tool is generally extracted, a circuit simulation is executed by using an electronic design automation (EDA) tool. In this case, a transistor is completely turned ON to judge whether or not a current is conducted to fixed potentials through the transistor. Although the criteria for detecting floating error terminals are different, depending upon EDA tools, in almost circuit simulators, whether or not there is a path that is conducted to a fixed potential judges the existence or nonexistence of the floating error terminals (see Japanese Patent application Laid Open No. 1993-74948 and Japanese Patent application Laid Open No. 2000-293555).

SUMMARY OF THE INVENTION

According to one embodiment of the present invention,
a verification equipment of a semiconductor integrated circuit comprising:
 a circuit net list extraction section that extracts the net list of a circuit,
 a circuit simulation execution section that executes a circuit simulation, based on the extracted net list,
 a finite impedance judgment section that judges the existence or nonexistence of finite impedances of the circuit,
 a floating error terminal judgment section that judges the existence or nonexistent of floating error terminals by measuring the existence or nonexistence of the finite impedances,
 a true floating error terminal judgment section that adds any one of a P channel-type transistor and an N channel-type transistor to the terminals of the circuit where it is judged that there are floating error terminals by the floating error terminal judgment section and calculates changes in potential at the terminals, and adds the other of the P channel-type transistor and the N channel-type transistor to the terminals and calculates changes in potential at the terminals,
 and an output section that outputs a judgment result of the floating error terminal judgment section and a judgment result of the true floating error terminal judgment section.

In addition, according to one embodiment of the present invention, a method of verifying a semiconductor integrated circuit comprising:
 extracting a net list of a circuit;
 executing a circuit simulation, based on the extracted the net list;
 judging the existence or nonexistence of finite impedances of the circuit;
 judging the existence or nonexistence of floating error terminals by measuring the existence or nonexistence of the finite impedances, judging the existence or nonexistence of true floating error terminals by adding any one of the P channel-type transistor and the N channel-type transistor to terminals of the circuit where it is judged that there are floating error terminals and calculating changes in potential of the terminals and adding the other of the P channel-type transistor and the N channel-type transistor to the terminals and calculating changes in potential at the terminals;
 and outputting a judgment result of the floating error terminals and a judgment result of the true floating error terminals.

DETAILED DESCRIPTION OF THE INVENTION

The verification equipment of a semiconductor integrated circuit and the method of verifying a semiconductor integrated circuit of the first embodiment in the present invention are described below in detail with reference to the drawings. In addition, in the below-mentioned embodiments, the examples of the verification equipment of a semiconductor integrated circuit and the method of verifying a semiconductor integrated circuit of the first embodiment in the present invention are shown, and the verification equipment of a semiconductor integrated circuit and the method of verifying a semiconductor integrated circuit of the first embodiment in the present invention are not limited to those embodiments only.

Embodiment 1

Figure 1A:
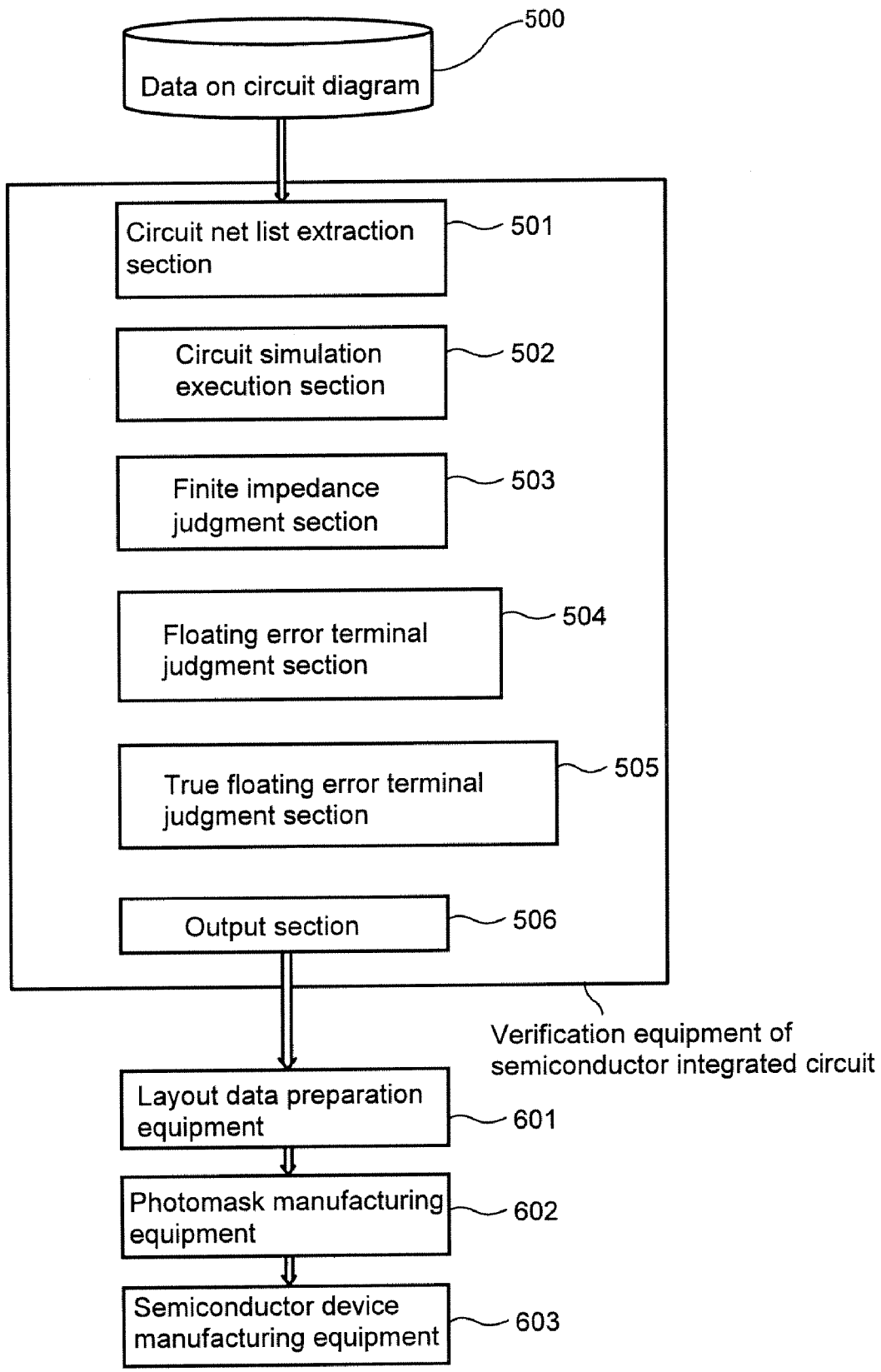
FIG. 1A is a block diagram showing a composition example of a first embodiment of verification equipment of a semiconductor integrated circuit in the present invention.

FIG. 1A is a block diagram showing a composition example of the verification equipment of a semiconductor integrated circuit of the first embodiment in the present invention. As shown in FIG. 1A, the verification equipment of a semiconductor integrated circuit of the first embodiment in the present invention is provided with a net list extraction section 501 that extracts the net list of a circuit connected to fixed potentials from circuit diagram data 500 of the semiconductor integrated circuit, a circuit simulation execution section 502 that executes a circuit simulation of the circuit, based on the extracted net list, a finite impedance judgment section 503 that judges the existence or nonexistence of finite impedances in the entire circuit, based on the net list, a floating error terminal judgment section 504 that judges the existence or nonexistence of floating error terminals by measuring the existence or nonexistence of finite impedances, a true floating error terminal judgment section 505 that judges whether or not terminals judged to be of a connection error by the floating error judgment section 504 are each a true floating error, and an output section 506 that outputs a judgment result of the floating error terminal judgment section 504 and a judgment result of the true floating error terminal judgment section 505. In addition, the rear stage of the verification equipment of a semiconductor integrated circuit has a layout data preparation equipment 601 that prepares a layout data from a circuit diagram verified in the verification equipment of a semiconductor integrated circuit. The rear stage of the layout data preparation equipment 601 has a photomask manufacturing equipment 602 that manufactures a photomask having a mask pattern using an electron beam (EB) lithographic equipment or the like, based on a layout data prepared in the layout data preparation equipment 601. The rear stage of the photomask manufacturing equipment 602 has the semiconductor device manufacturing equipment 603 that manufactures a semiconductor device by forming the pattern of a semiconductor integrated circuit or the like on a substrate using the photomask manufactured in the photomask manufacturing equipment 602.

Figure 1B:
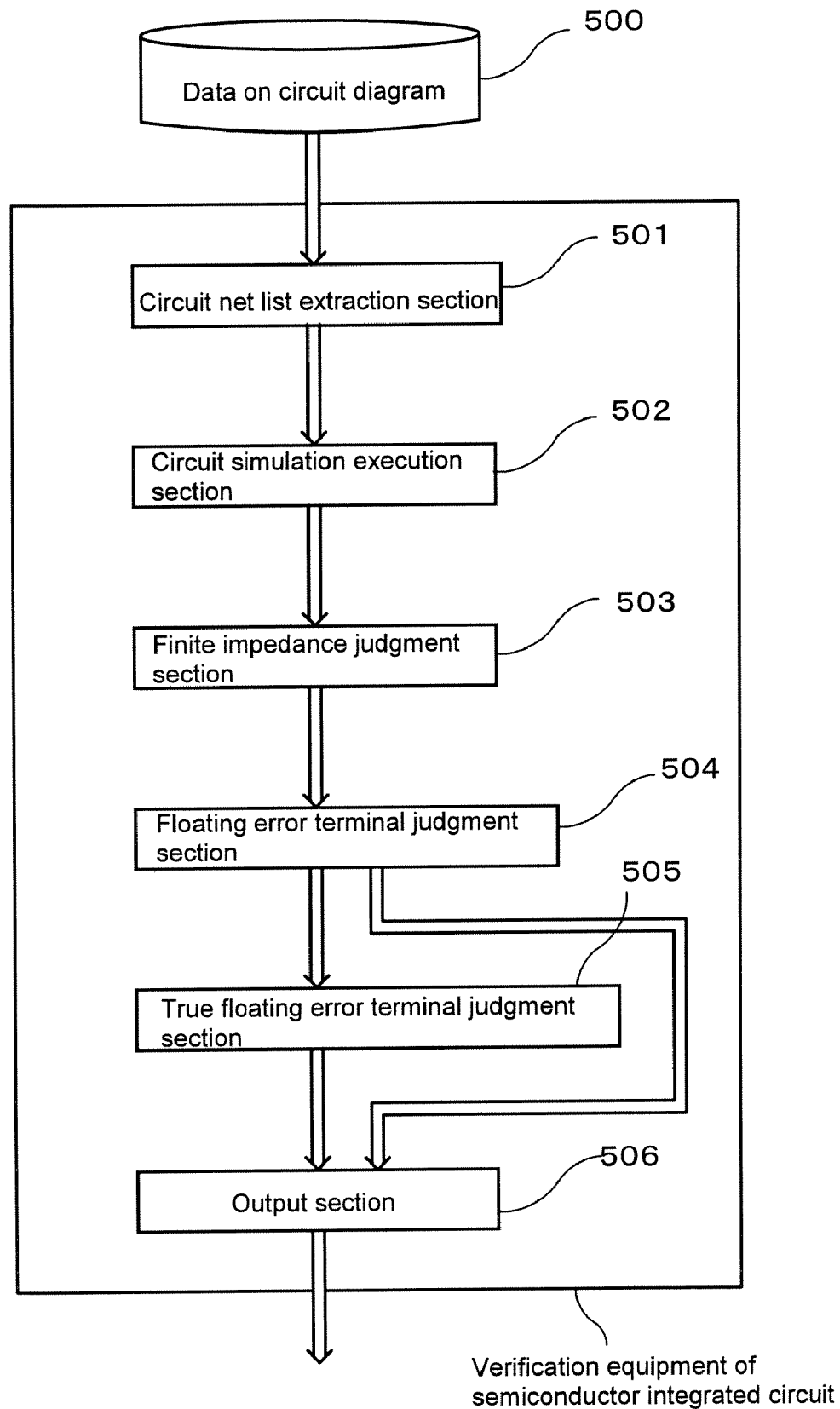
FIG. 1B is a block diagram showing a composition example of the first embodiment of verification equipment of a semiconductor integrated circuit in the present invention.
Figure 1C:
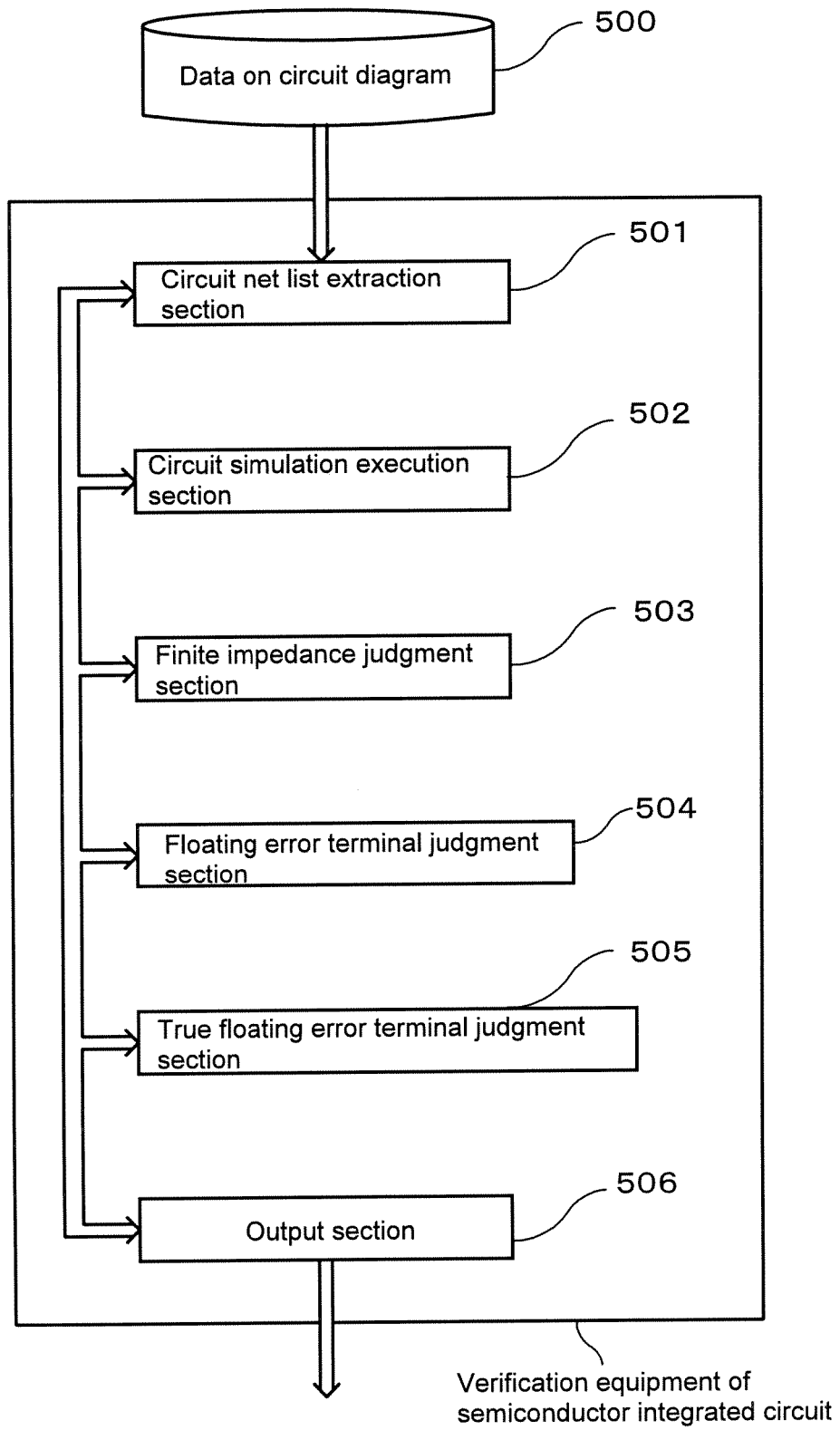
FIG. 1C is a block diagram showing a composition example of the first embodiment of verification equipment of a semiconductor integrated circuit in the present invention.

In the verification equipment of a semiconductor integrated circuit of the first embodiment in the present invention, FIG. 1A shows the data flow in the circuit net list extraction section 501, the circuit simulation execution section 502, the finite impedance judgment section 503, the floating error terminal judgment section 504, the true floating error terminal judgment section 505, and the output section 506. In addition, the data flow in the verification equipment of a semiconductor integrated circuit of the first embodiment in the present invention is not limited to one only shown in FIG. 1A, as shown in FIG. 1B and FIG. 1C, a data exchange may be also performed mutually between the circuit net list extraction section 501, the circuit simulation execution section 502, the finite impedance judgment section 503, the floating error terminal judgment section 504, the true floating error terminal judgment section 505, and the output section 506. In addition, although FIG. 1B and FIG. 1C have the layout data preparation equipment 601, the photomask manufacturing equipment 602 and the semiconductor device manufacturing equipment 603 shown in FIG. 1A likewise, the illustrations thereof are omitted.

Figure 2:
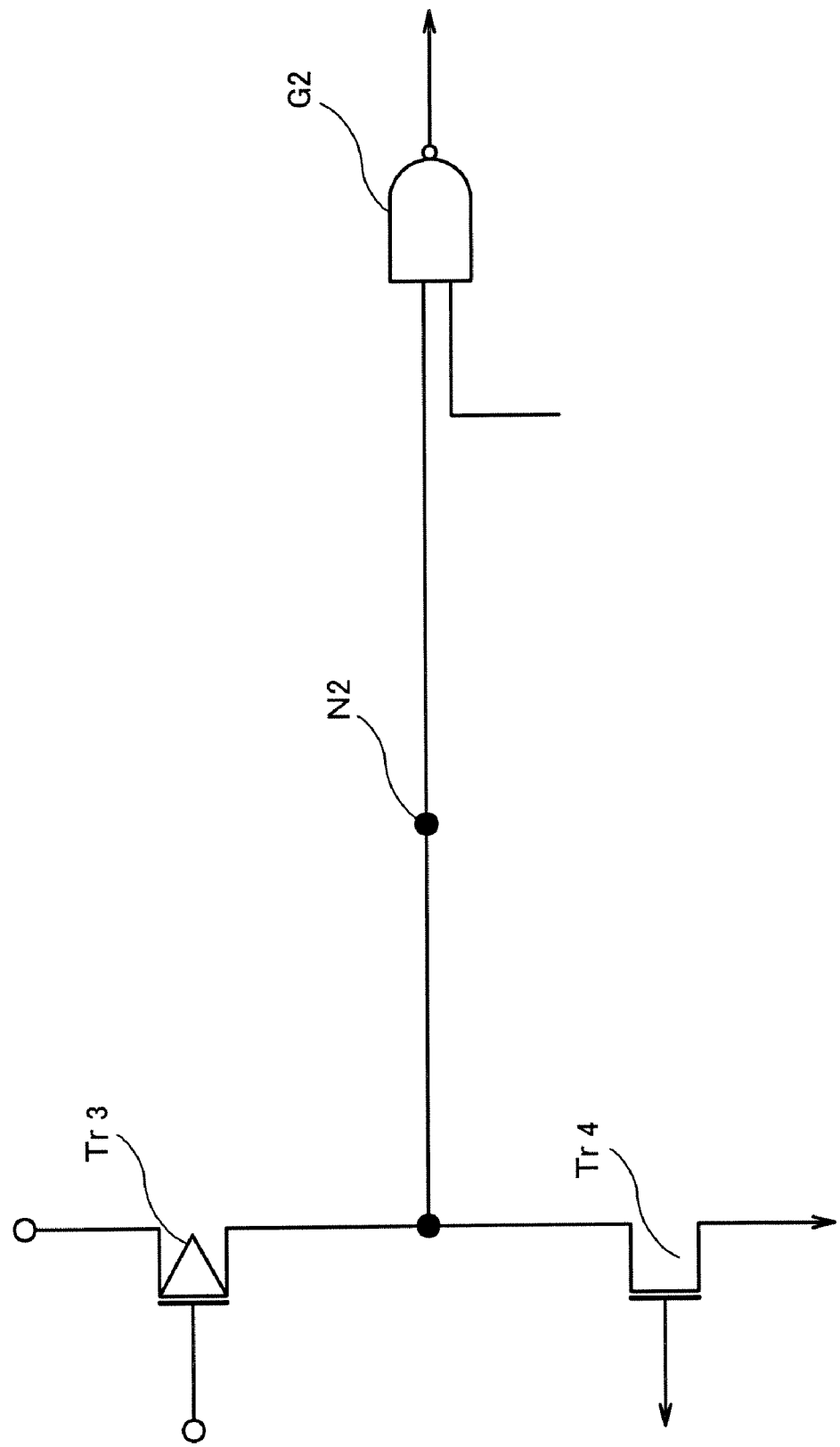
FIG. 2 is a diagram showing a circuit diagram in case it is judged that there are floating errors by performing floating check of the first embodiment of verification equipment of a semiconductor integrated circuit in the present invention.

Next, the operation flow of the verification equipment of a semiconductor integrated circuit of the first embodiment in the present invention is described in detail with reference to the drawings. FIG. 2 is an example of a circuit diagram in case floating check is performed and it is judged that there are floating error terminals, and FIG. 3 and FIG. 4 are the flowcharts each showing one example of processing of the method of verifying the verification equipment of a semiconductor integrated circuit of the first embodiment in the present invention.

Figure 3:
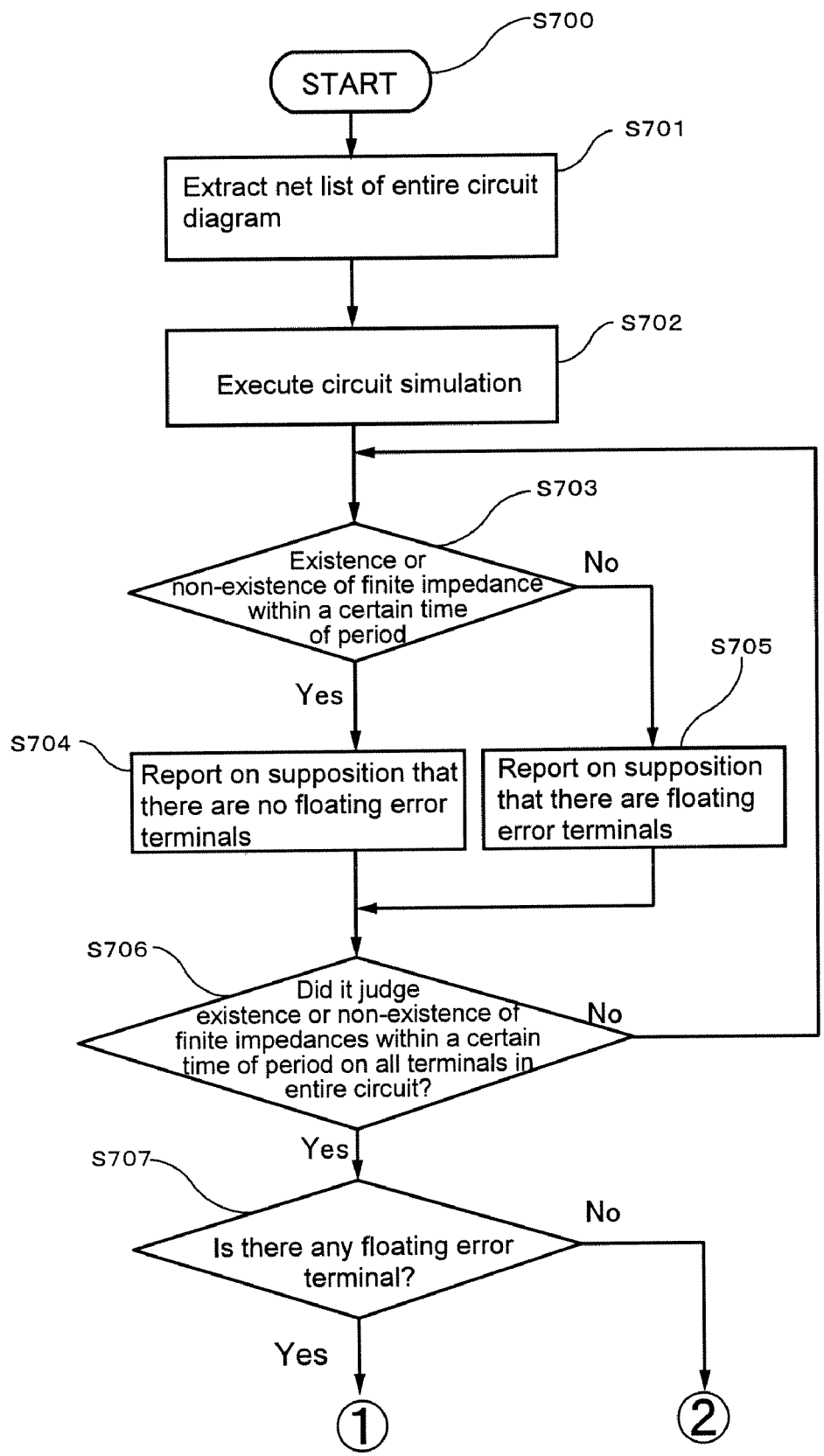
FIG. 3 is a flowchart showing one processing example of a verifying method of the first embodiment of verification equipment of a semiconductor integrated circuit in the present invention.
Figure 4:
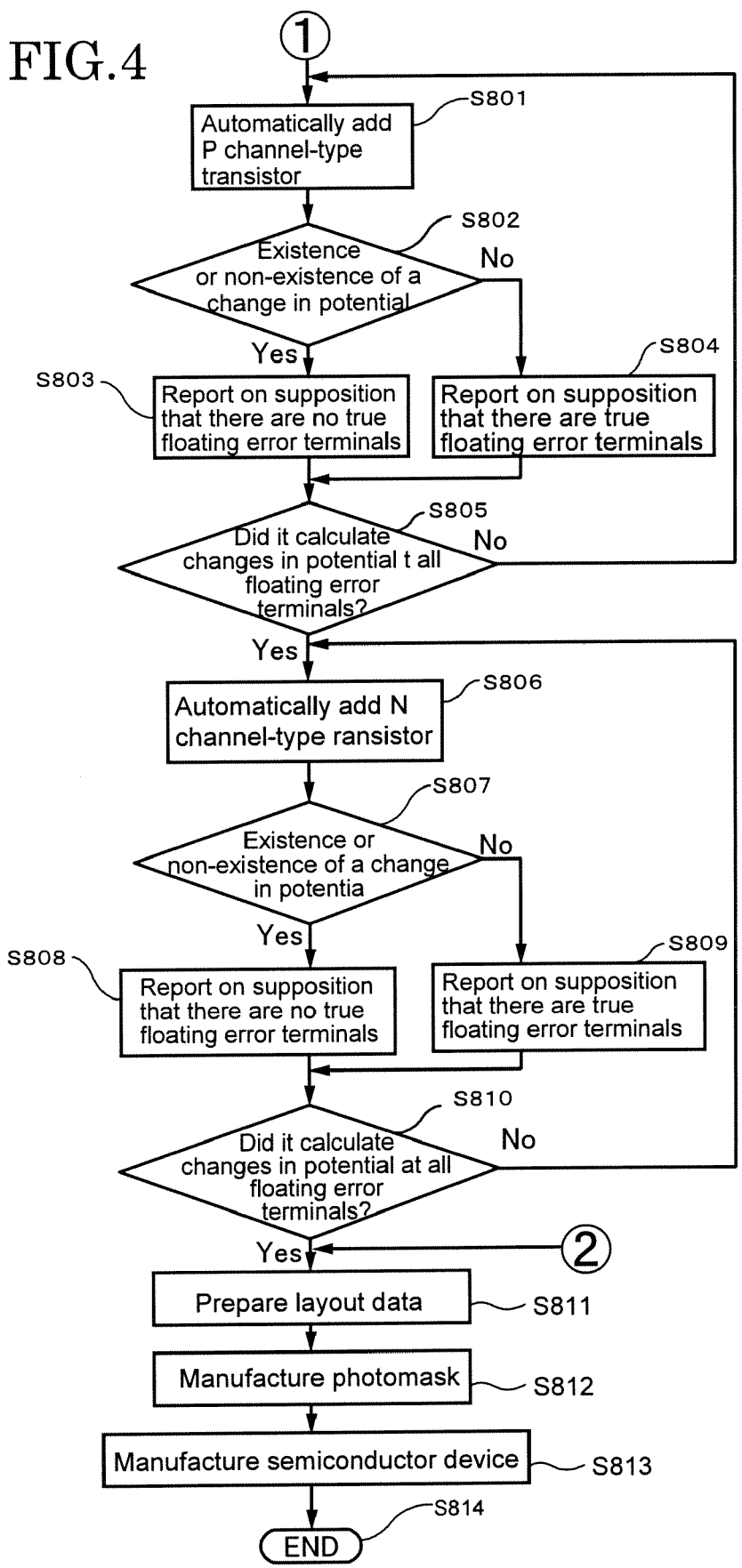
FIG. 4 is a flowchart showing one processing example of a verifying method of the first embodiment of verification equipment of a semiconductor integrated circuit in the present invention.

As shown in FIG. 3, first, the circuit net list extraction section 501 extracts the net list of a circuit connected to fixed potentials from data on the circuit diagram of a semiconductor integrated circuit (step S701).

Next, the circuit simulation execution section 502 executes a circuit simulation on all the terminals in the entire circuit using the EDA tool, based on the extracted net list (step S702).

In the circuit simulation, the finite impedance judgment section 503 judges the existence or nonexistence of finite impedances within a certain time of period on all the terminals in the entire circuit, based on the net list (step S703).

Then, it judges the existence or nonexistence of finite impedances within a certain time of period in all the terminals (step S703). If there are finite impedances within a certain time of period in all the terminals (step S703: Yes), the floating error terminal judgment section 504 judges that there are not floating error terminals in the circuit and gives the judgment result to the output section 506. The output section 506 is composed of display equipment and a printer, the judgment result from the floating error judgment section 504 is displayed in the display equipment and/or is printed out to output the judgment result (step S704).

Next, the finite impedance judgment section 503 judges whether or not the existence or nonexistence of finite impedances within a certain time of period is judged on all the terminals in the entire circuit, and if it judges whether or not the existence or nonexistence of finite impedances is judged on all the terminals in the entire circuit, a verification processing in step S707 later described is executed (step S706: Yes).

On the other hand, if the finite impedance judgment section 503 judges the existence or nonexistence of finite impedances is not judged on all the terminals in the entire circuit, verification processings in step S703 to step S705 is executed on terminals for which the finite impedance judgment section 503 judges that the existence or nonexistence of finite impedances is not judged (step S706: No).

Next, if the floating error terminal judgment section 504 judges that there are floating error terminals in a specific circuit (step S705), verification processing after step S801 later described is executed (step S707: Yes).

On the other hand, if the floating error terminal judgment section 504 judges that there are not floating error terminals on all the terminals in the entire circuit (step S707: No), it advances to step S811 later described.

Figure 5:
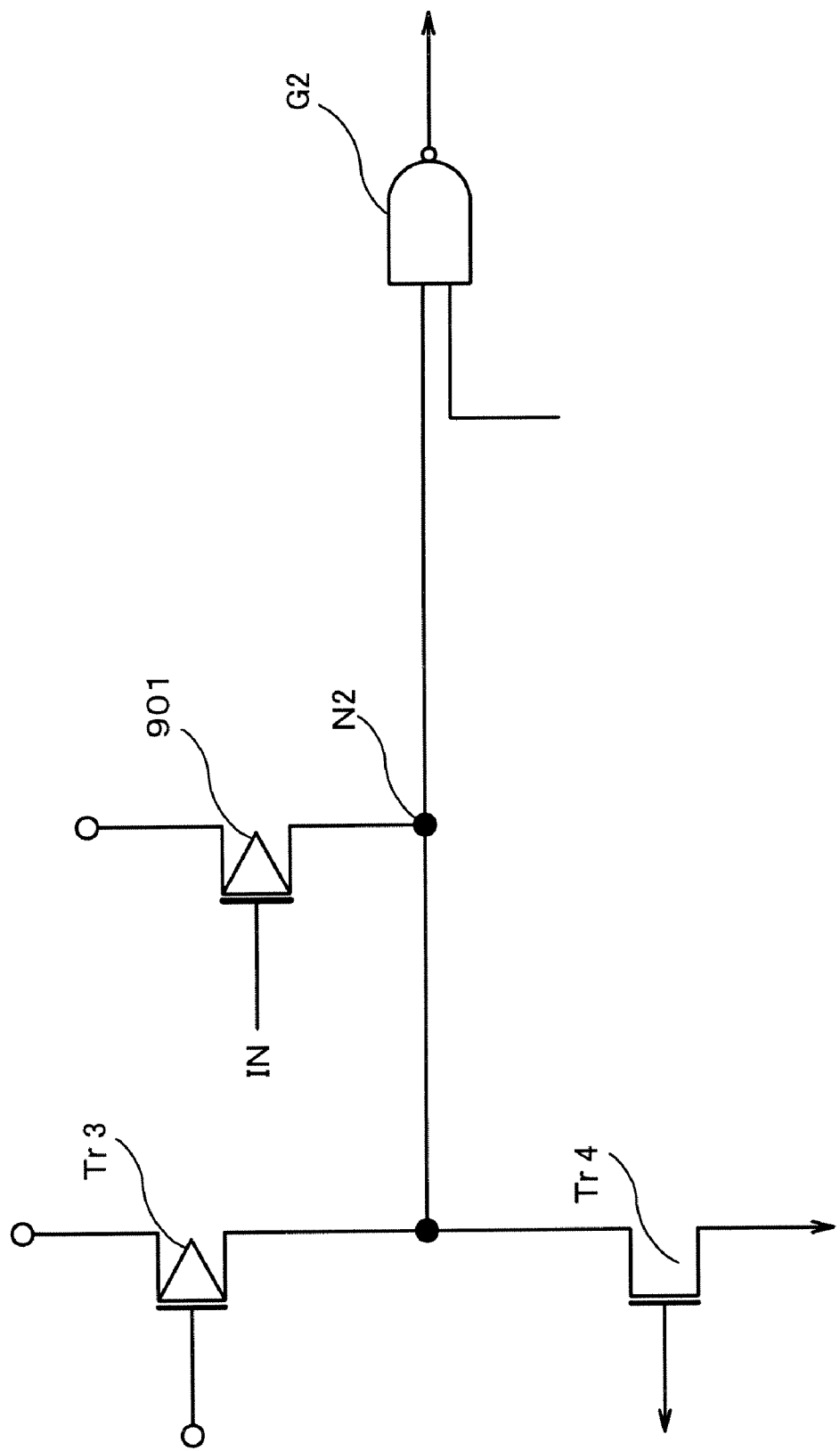
FIG. 5 is a diagram showing one example of a circuit diagram in case a P channel-type transistor is connected to a floating error terminal of the first embodiment of verification equipment of a semiconductor integrated circuit in the present invention.

On the other hand, if it is judged that there are floating error terminals in a specific circuit (step S707: Yes), the true floating error judgment section 505 adds a P channel-type transistor 901 where a source or drain is connected to a terminal N2 as shown in FIG. 5 to the terminal N2 which is judged to be of a floating error (step S801), a change in potential of the terminal N2 within a predetermined time of period in the terminal N2 is calculated (step S802). In addition, a channel width of the P channel-type transistor 901 is smaller than those of transistors Tr3 and Tr4 used for a circuit to which a terminal N1 is connected. The channel width of the P channel-type transistor 901 may be also $\frac{1}{100}$ times or more and $\frac{1}{10}$ times or less those of the transistors Tr3 and Tr4 used for the circuit to which the terminal N2 is connected.

Figure 6:
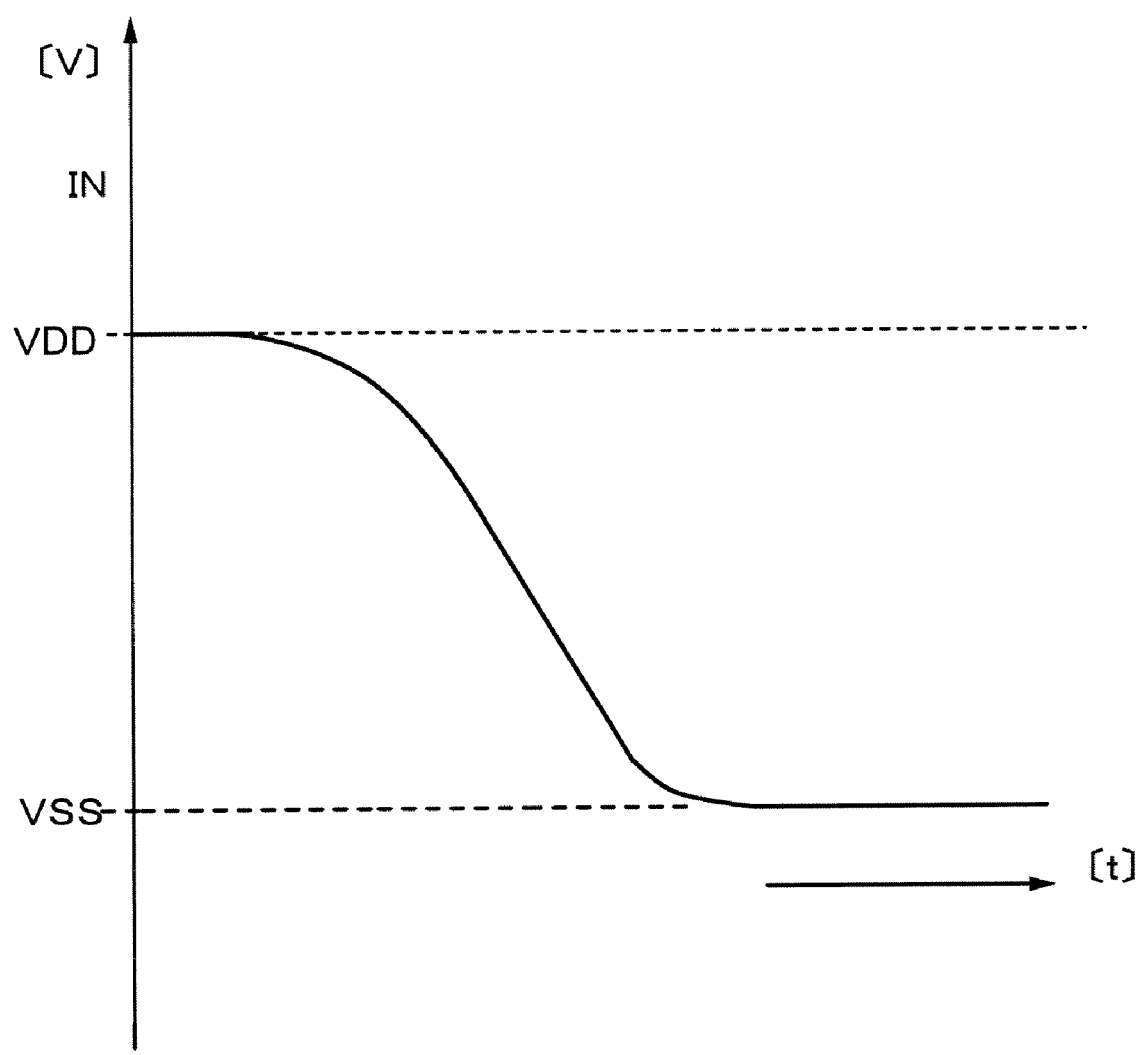
FIG. 6 is a diagram showing a change in a potential 1N (for example, VDD->VSS) in case a potential 1N (for example, VDD->VSS) is applied to a gate of a P channel-type transistor of the first embodiment of verification equipment in a semiconductor integrated circuit in the present invention.

Here, in step S802, a potential IN (for example, VDD→VSS) as shown FIG. 6 is applied to a gate of the P channel-type transistor 901 to drive the P channel-type transistor 901. In addition, here, applying the potential IN (for example, VDD->Vss) to the P channel-type transistor 901 is to prevent spike current from flowing in the P channel-type transistor 901. In addition, in the first embodiment, the potential IN (for example VDD->VSS) as shown in FIG. 6 is applied to the gate of the P channel-type transistor 901 to drive the P channel-type transistor 901. In addition, in the verification equipment of a semiconductor integrated circuit of the first embodiment in the present invention, the application of a potential is not limited to such a method of applying the potential, an arbitrary potential may be applied to drive the P channel-type transistor 901.

Figure 7:
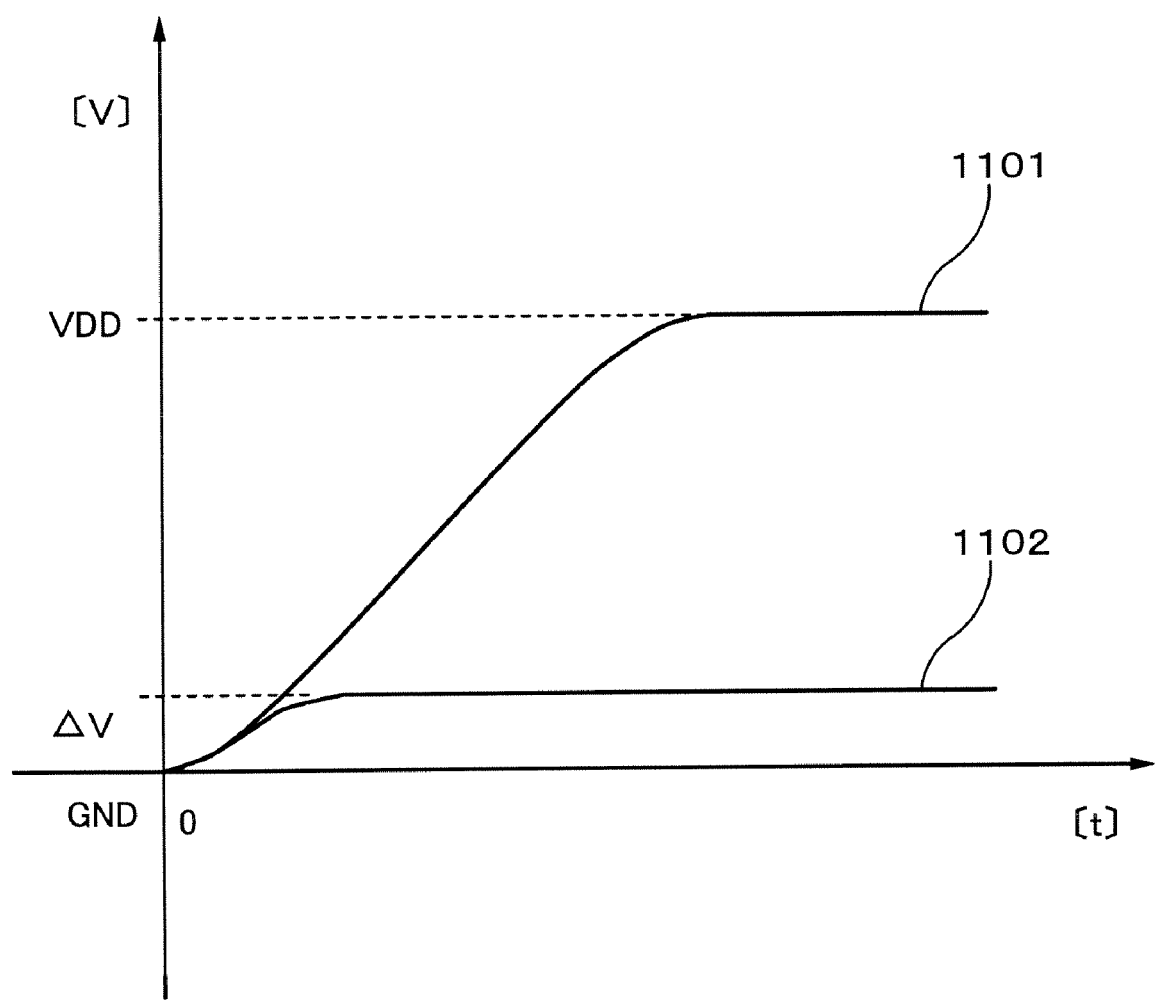
FIG. 7 is a diagram showing a change in a potential at a terminal in case a P channel-type transistor is connected to a floating error terminal of the first embodiment of verification equipment of a semiconductor integrated circuit in the present invention.

In step S802, when the terminal N2 is a true floating error terminal, if a change in a potential at the terminal N2 in FIG. 5 to which the P channel-type transistor 901 is added is calculated, it is as shown in the characteristic curve 1101 in FIG. 7. Namely, although the potential of the terminal N2 is initially in uncertain state, the gate potential of the P channel-type transistor 901 is sequentially being turned ON, as a certain time of period lapses, the potential of the terminal N2 rises from a GND to a VDD as shown in the characteristic curve 1101. If such a change in potential is calculated at the terminal N2, the true floating error terminal judgment section 505 judges that the terminal N2 is a true floating error terminal (step S802: No) and gives the judgment result to the output section 506 (step S804).

On the other hand, in step S802, if the terminal N2 is not a floating error terminal, there is inevitably path to a fixed potential. Because the channel width of the P channel-type transistor 901 is smaller than those of transistors Tr3 and Tr4 used for a circuit to which the terminal N2 is connected, as the capacity for driving the P channel-type transistor 901 is insufficient, the current scarcely flows in the P channel-type transistor 901, as shown in the characteristic curve 1102 in FIG. 7, the potential of the terminal N2 does not vary over a constant value. If such a change in potential is calculated, the true floating error terminal judgment section 505 judges that the terminal N2 is not a true floating error terminal (step S802: Yes) and gives the judgment result to the output section 506 (step S803).

Next, the true floating error terminal judgment section 505 judges whether or not the P channel-type transistor 901 is connected to all the terminals that are judged to be of a floating error in step S705 and changes in potential at all the terminals are calculated (step S805). If the true floating error terminal judgment section 505 judges that the P channel-type transistor 901 is connected to all the floating error terminals and changes in potential at all the terminals are calculated (step S805: Yes), the verifying methods after step S806 later described is executed.

On the other hand, if the true floating error terminal judgment section 505 judges that the P channel-type transistor 901 is connected to all the terminals that are judged to be of floating error in step S705 and changes in potential at the terminals are not calculated (step S805: No), the true floating error terminal judgment section 505 executes the verifying methods in step S801 to step S804 on all the floating error terminals for which changes in potential are not judged.

Figure 8:
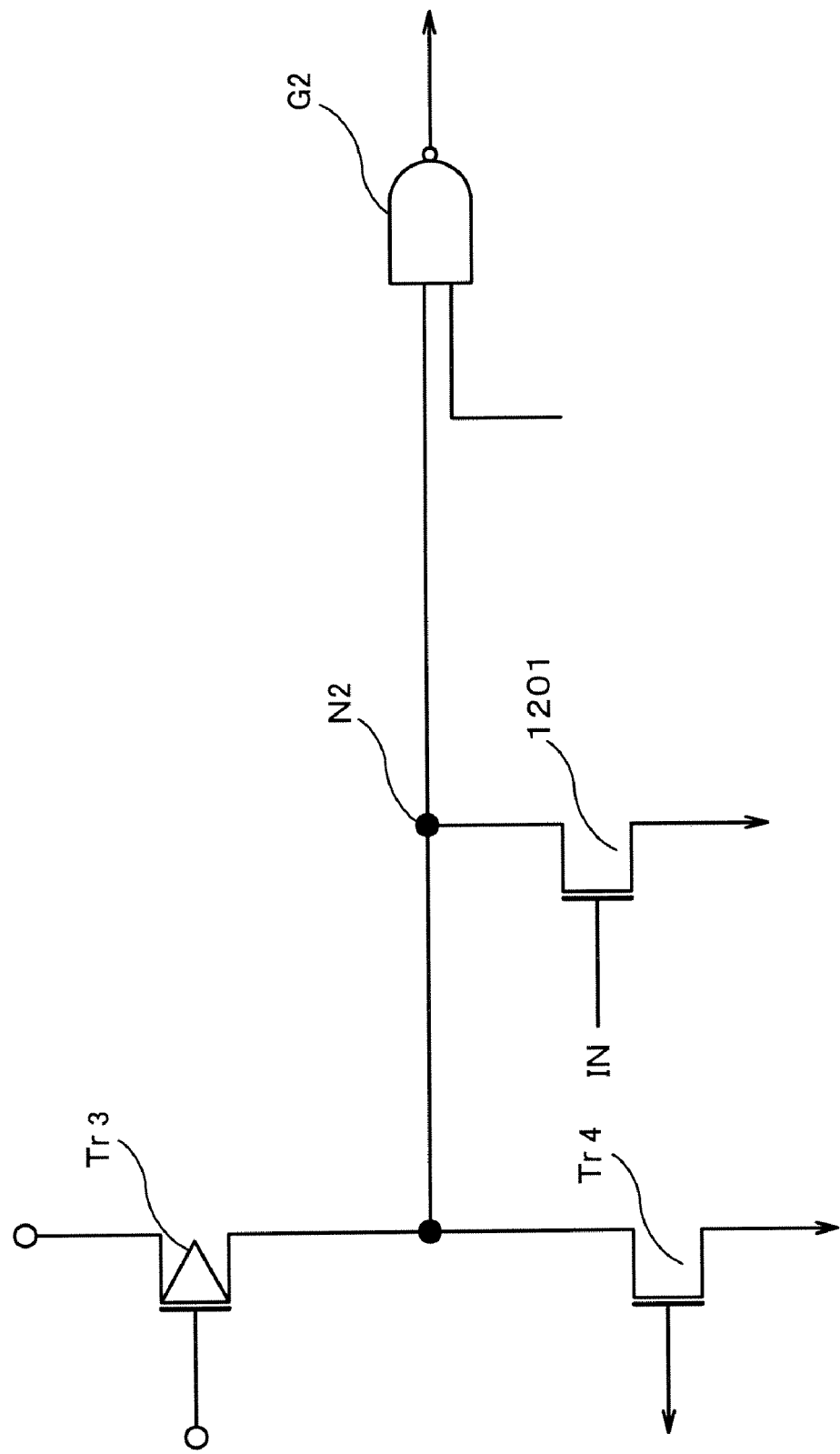
FIG. 8 is a diagram showing one example of a circuit diagram in case an N channel-type transistor is connected to a floating error terminal of the first embodiment of verification equipment of a semiconductor integrated circuit in the present invention.

Next, the true floating error judgment section 505 adds an N channel-type transistor 1201 where a source or drain is connected to the terminal N2 as shown in FIG. 8 to the terminal N2 to which the P channel-type transistor 901 is added in step S802 (step S806) and calculates a change in potential at the terminal N2 within a predetermined time of period at the terminal N2 (step S807). In addition, the channel width of the N channel-type transistor 1201 is smaller than those of the transistors Tr3 and Tr4 used for the circuit to which the terminal N2 is connected. The channel width of the N channel-type transistor 1201 may be also ¹⁄₁₀₀ times or more and ¹⁄₁₀ times or less those of the transistors Tr3 and Tr4 used for the circuit to which the terminal N2 is connected.

Figure 9:
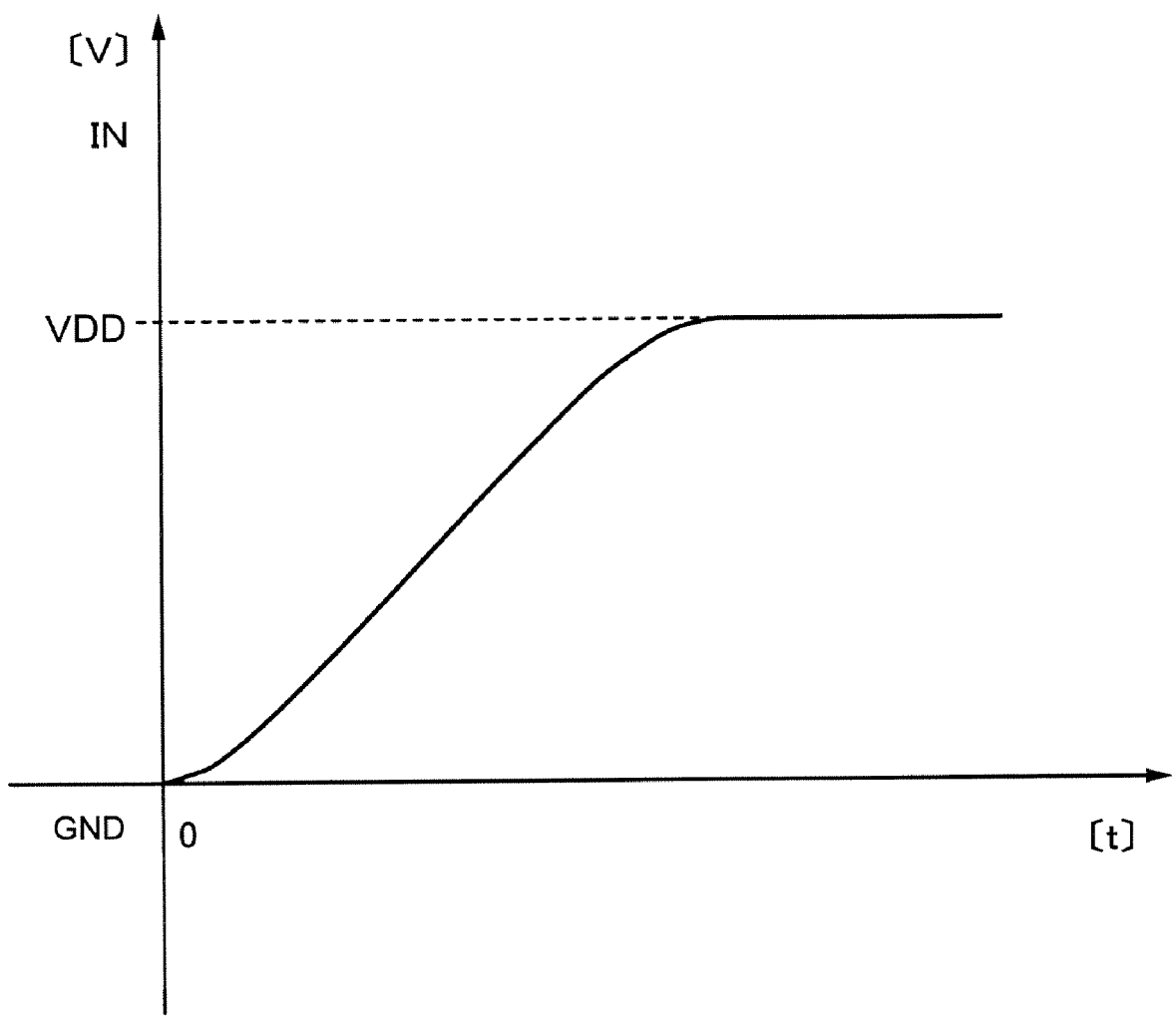
FIG. 9 is a diagram showing a change in a potential 1N (for example, GND->VDD) in case a potential 1N (for example, GND->VDD) is applied to a gate of an N channel-type transistor of the first embodiment of verification equipment of a semiconductor integrated circuit in the present invention.

Here, in step S807, the potential IN (for example, GND->VDD) as shown in FIG. 9 is applied to a gate of the N channel-type transistor 1201 to drive the N channel-type transistor 1201. In addition, here, applying the potential IN (for example, GND->VDD) to the N channel-type transistor 1201 is to prevent spike current from flowing in the N channel-type transistor 1201. In addition, in the first embodiment in the present invention, the terminal IN (for example, GND->VDD) as shown FIG. 9 is applied to the gate of the N channel-type transistor 1201 to drive the N channel-type transistor 1201. In addition, in the verification equipment of a semiconductor integrated circuit of the first embodiment in the present invention, the application of a potential is not limited to such a method of applying the potential, and an arbitrary potential may be applied to drive the N channel-type transistor 1201.

In step S807, when the terminal N2 is a true floating error terminal (step S807: No), if a change in potential at the terminal N2 in FIG. 8 to which the N channel-type transistor 1201 is added is calculated, it is as shown in the characteristic curve 1401 in FIG. 10. Namely, although the potential of the terminal N2 is initially in uncertain state, the gate potential of the N channel-type transistor is sequentially being tuned ON, as a certain time of period lapses, the potential of the terminal N2 lowers from GND to VSS as shown in the characteristic curve 1401. If such a change in potential is calculated at the terminal N2, the true floating error terminal judgment section 505 judges that the terminal N2 is a true floating error terminal and gives the judgment result to the output section 506 (step S809).

On the other hand, in step S807, if the terminal N2 is not a floating error terminal, there is inevitably path to a fixed potential. Because the channel width of the P channel-type transistor 1201 is smaller than those of the transistors Tr3 and Tr4 used for the circuit to which the terminal N2 is connected and the capacity for driving the N channel-type transistor 1201 is insufficient, the current scarcely flows in the N channel-type transistor 1201, and the potential of the terminal N2 does not vary over a certain value, as shown in the characteristic curve 1402 in FIG. 10. If such a change in potential is calculated, the true floating error terminal judgment section 505 judges that the terminal N2 is not a true floating error terminal (step S807: Yes) and gives the judgment result to the output section 506 (step S808).

Next, the true floating error terminal judgment section 505 judges whether or not the N channel-type transistor 1201 is connected to all the terminals that are judged to be of a floating error in step S705 and changes in potential at the terminals are calculated (step S810). If the true floating error terminal judgment section 505 judges that the N channel-type transistor 1201 is connected to all the floating error terminals and changes in potential at the terminals are calculated (step S810: Yes), the method of verifying a semiconductor integrated circuit of the first embodiment in the present invention is finished and it advances to step S811.

On the other hand, if the true floating error terminal judgment section 505 judges that the N channel-type 1201 is connected to all the terminals that are judged to be of a floating error in step S705 and changes in potential at the terminals are not calculated (step S810: No), the true floating error terminal judgment section 505 executes the verifying methods in step S806 to step S809 on all the floating error terminals where changes in potential are not judged (step S810).

Next, the layout data preparation equipment 601 prepares a layout data from the circuit diagram verified by the method of verifying the verification equipment of a semiconductor integrated circuit in step S811. Then, the photomask manufacturing equipment 602 manufactures a photomask having a mask pattern using an electron beam (EB) lithographic equipment or the like, based on the layout data prepared in the layout data preparation equipment 601 in step S812. Then, the semiconductor device manufacturing equipment 603 forms the pattern of a semiconductor integrated circuit or the like on a substrate using the photomask manufactured in the photomask manufacturing equipment 602 to manufacture a semiconductor device in step S813. The processing of the first embodiment in the present invention is finished after manufacturing the semiconductor device (step S814).

As is described in the foregoing, according to the verification equipment of a semiconductor integrated circuit of the first embodiment in the present invention, it is possible to remove pseudo floating error terminals out of a floating error date detected in analyzing floating error terminals in a semiconductor integrated circuit and automatically detect true floating error terminals only.

In addition, in the above descriptions, the case where the P channel-type transistor is added to a floating error terminal in step S801 and the N channel-type transistor is added to a floating error terminal in step S806 is shown. Even if the N channel-type transistor is added to a floating error terminal in step S801 and the P channel-type transistor is added to a floating error terminal in step S806, the operations are the same.

Therefore, it is also possible that the composition of the verifying equipment of a semiconductor integrated circuit is such that individual net lists are beforehand prepared with regard to both the P channel-type transistor and the N channel-type transistor and floating check is simultaneously performed thereon.

Figure 11:
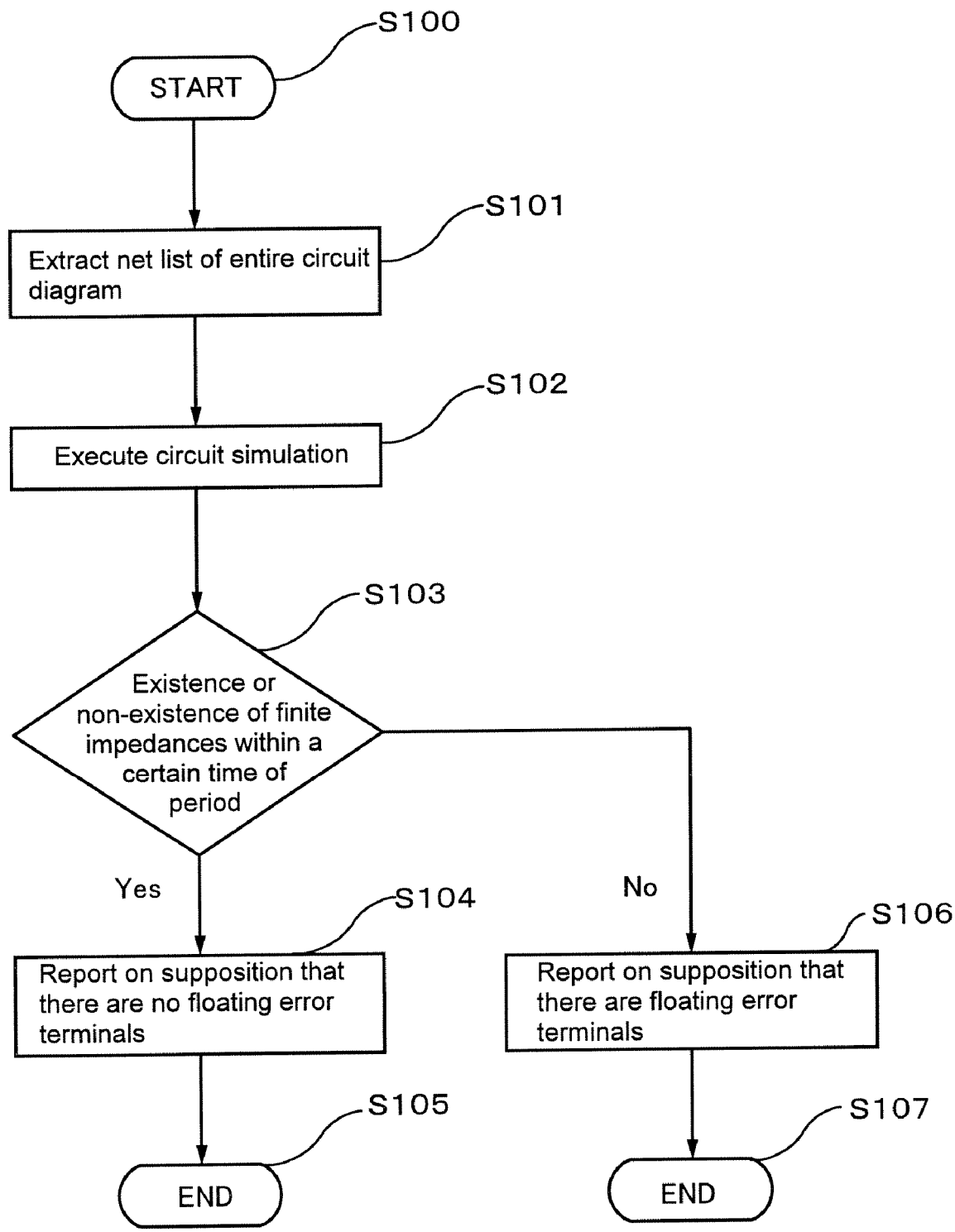
FIG. 11 is a flowchart showing a processing example of the first embodiment of verification equipment of a semiconductor integrated circuit in the present invention.

In addition, here, the major processings of the floating check are described with reference to the flowchart shown in FIG. 11. First, the net list of the entire circuit is extracted (step S101). Next, a circuit simulation is executed thereon (step S102). In the circuit simulation, the existence or nonexistence of finite impedances is judged within a certain time of period on a terminal. Then, the existence or nonexistence of finite impedances is judged within a certain time of period at all the terminals (step S103), if there are finite impedances within a certain time of period at all the terminals, it is reported on the supposition that there are not floating error terminals (step S104), and if there are not finite impedances within a certain time of period in a specific terminal, the specific terminal is reported as a floating error terminal (step S106).

In such a floating check, terminals that are judged to be floating error terminals may include true floating error terminals and terminals are reported such that they are not connected to fixed potentials even if they are connected thereto, i.e., pseudo floating error terminals.

Figure 12:
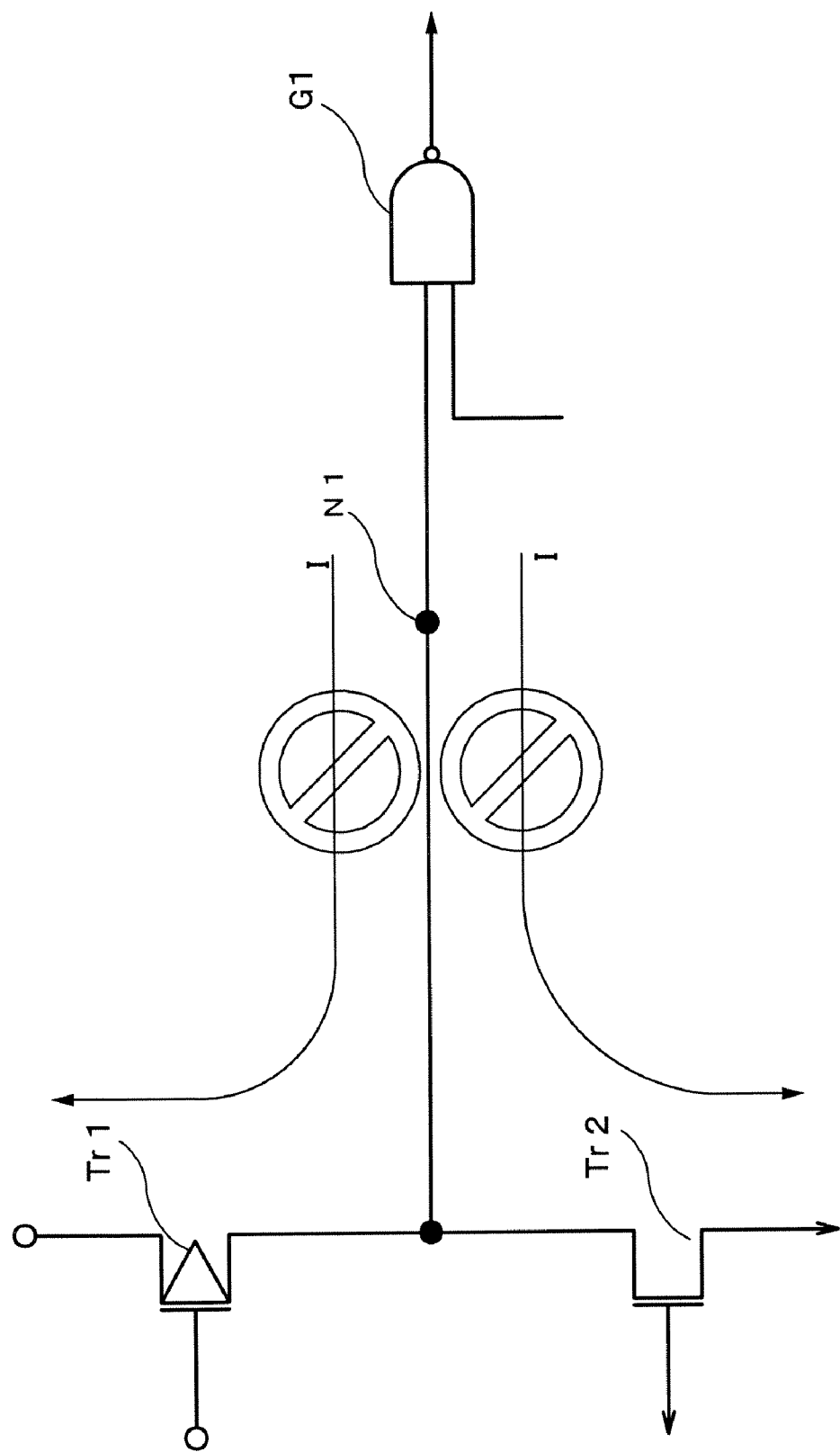
FIG. 12 is a diagram showing one example of a circuit diagram in case of a true floating error of the first embodiment of verification equipment of a semiconductor integrated circuit in the present invention.

FIG. 12 is an example of the circuit diagram in case the terminal N1 is a true floating error terminal. In the example of the circuit diagram shown in FIG. 12, the terminal NI is connected to the fixed potential VSS or VDD through the transistors Tr1, Tr2. However, if a circuit is configured so as to allow both the transistors Tr1 and Tr2 to be in non-continuity on stand-by due to a mistake in a design at a logic circuit diagram preparation stage or the like, the terminal N1 is a floating error terminal. Therefore, when a gate circuit G1 is provided if the terminal N1 is inputted, through current may be highly likely to occur because a gate level is in uncertain condition.

Figure 13A:
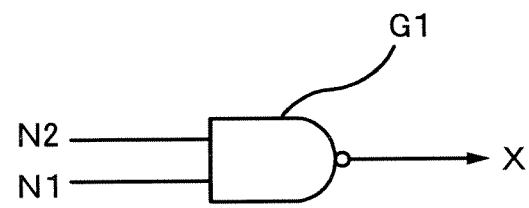
FIG. 13A is a diagram showing one example of a graphic symbol in an NAND gate circuit G1 of the first embodiment of verification equipment of a semiconductor integrated circuit in the present invention.
Figure 13B:
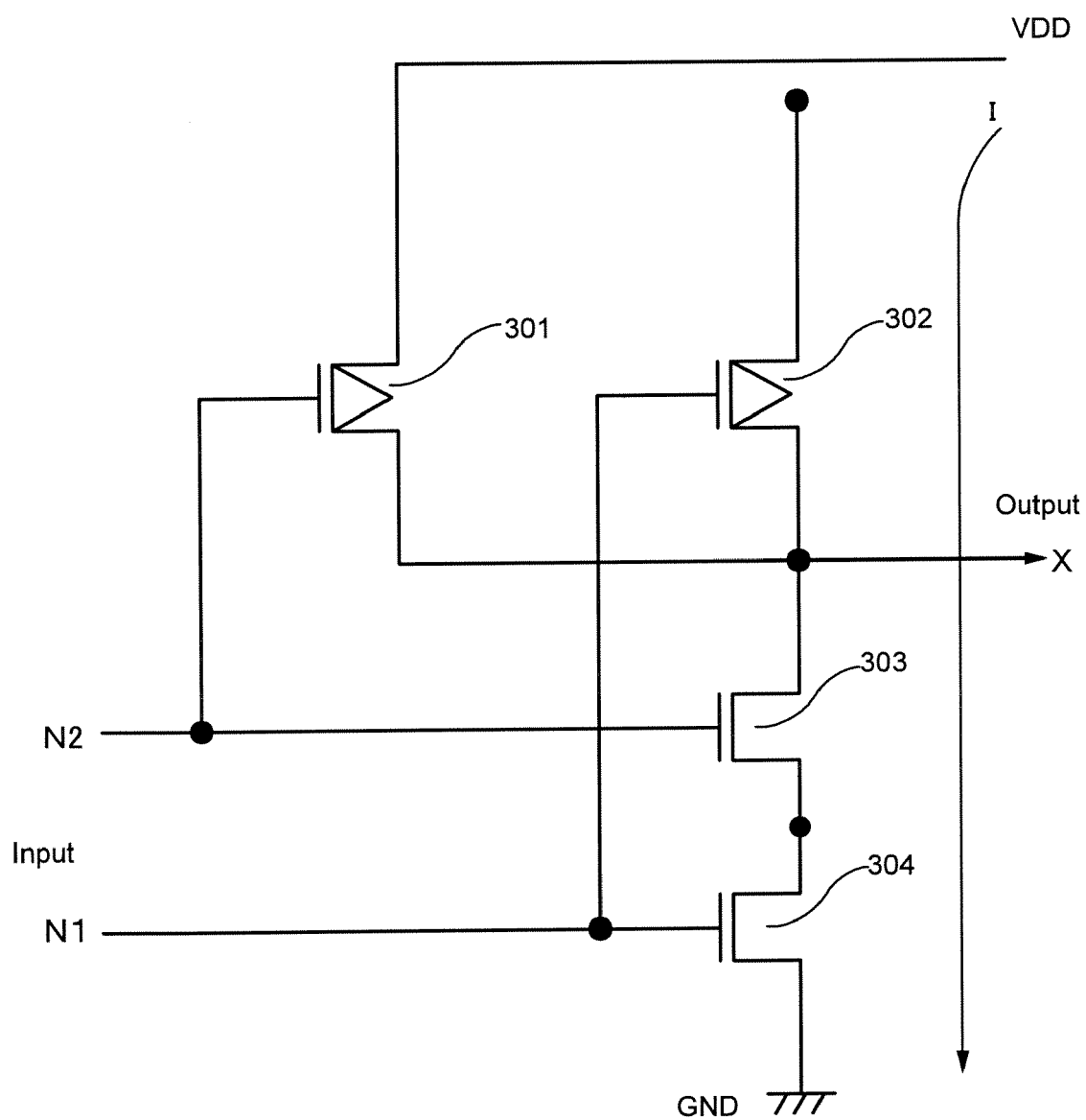
FIG. 13B is a diagram showing one example of a graphic symbol in an NAND gate circuit G1 of the first embodiment of verification equipment of a semiconductor integrated circuit in the present invention.

When this is described by using FIG. 13B in which the circuit diagram example of an NAND gate circuit G1 is shown, for example, if Hi is inputted at one input N2 of the NAND gate circuit G1, a P channel-type transistor 301 is turned OFF and an N channel-type transistor 303 is turned ON. In this case, if a potential that is inputted in the other input N1 is uncertain, the P channel-type transistor 302 and the N channel-type transistor 304 are in intermediate potential between VDD and GND, the N channel-type transistor 303, the N channel-type transistor 304, and the P channel-type transistor 302 are in condition that is weakly turned ON. Therefore, through current flowing from VDD to GND may possibly occur between the P channel-type transistor 302, the N channel-type transistor 303, and the N channel-type transistor 304 connected in series.

Figure 14:
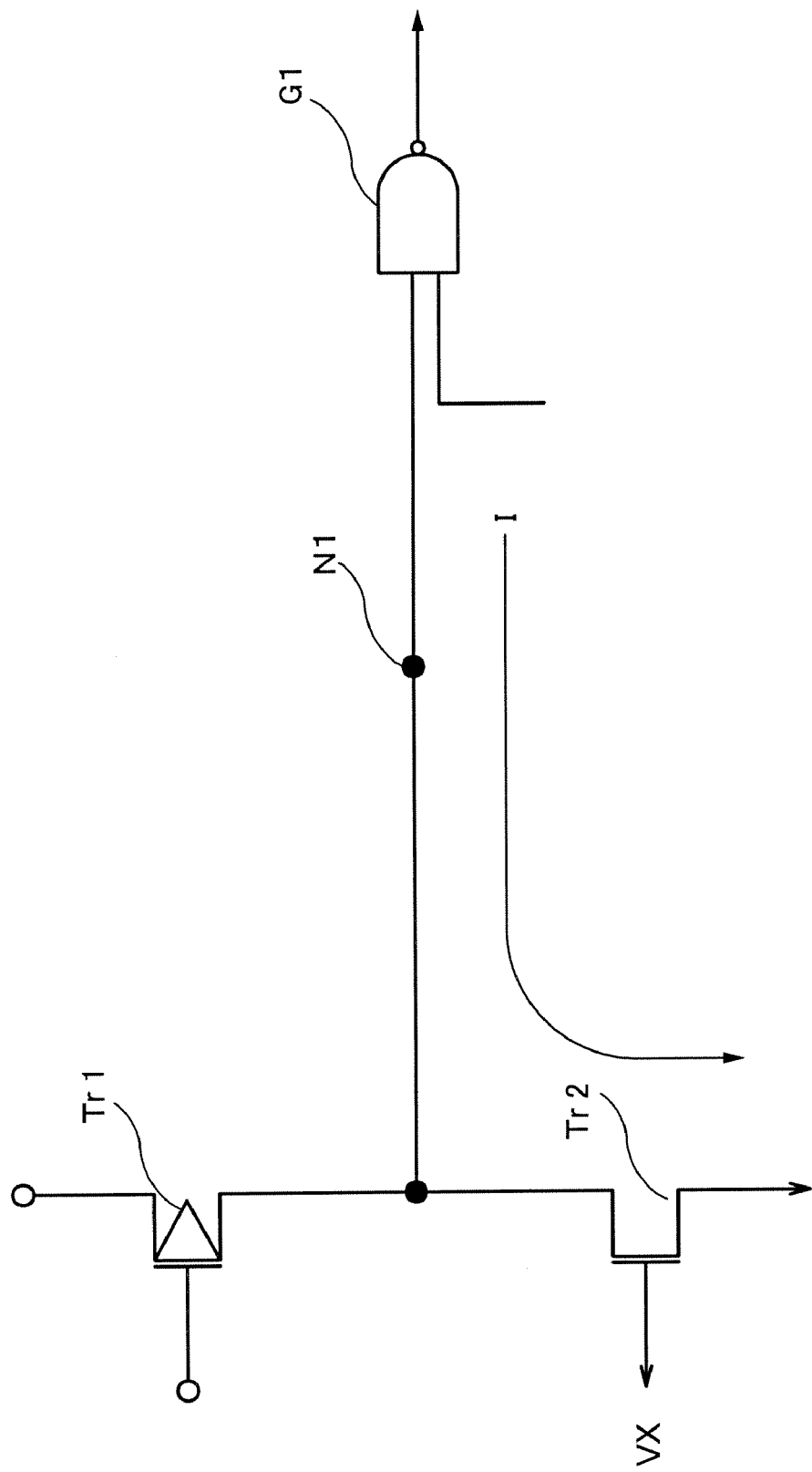
FIG. 14 is a diagram showing one example of a circuit diagram in case of a pseudo floating error of the first embodiment of verification equipment of a semiconductor integrated circuit in the present invention.

On the contrary, FIG. 14 is the example of a circuit diagram in case the terminal N1 is a pseudo floating error terminal. FIG. 12 is different from FIG. 14 in which an input of the transistor Tr2 is at an internal potential VX. In the circuit example shown in FIG. 14, it is connected to the fixed potential VSS through the transistor Tr2 and the terminal N1 can not be a floating error terminal. However, if the internal potential VX that is inputted at the transistor Tr2 is at a CMOS operation level, i.e., is not at the fixed potential VDD or VSS, the EDA tool may judge that the terminal N1 is a floating error terminal.

In a semiconductor integrated circuit where the fining of process is in progress, it is not rare that the number of floating error terminals that are detected and reported from the results of circuit simulations is often over ten thousand pieces. In the floating check shown in FIG. 11, because floating errors are detected only by the existence or nonexistence of finite impedances, it is necessary to visually confirm whether a floating error is a true connection error or a pseudo connection error one by one with reference to the circuit diagram. Then, it is possible to automatically detect true floating errors only by excluding the detection of pseudo floating errors.

Next, the process of manufacture of a semiconductor device of the first embodiment is described. The process of manufacture of a semiconductor device of the first embodiment in the present invention includes a lithographic process that performs a pattern transfer on a substrate using a photomask where a mask pattern is formed, based on a layout data prepared from the data on a circuit verified by the first embodiment or a lithographic process that directly plots a layout data on a substrate by processing equipment using an electronic beam or the like. Namely, for the process of manufacture of a semiconductor device of the first embodiment in the present invention, the photomask manufacturing equipment 602 forms a mask pattern on a photomask, based on the layout data prepared in the layout data preparation equipment 601 from the data on the circuit verified by the verification equipment of a semiconductor integrated circuit of the first embodiment. The semiconductor device manufacturing equipment 603 forms the pattern of a semiconductor integrated circuit on a substrate by exposure using the photomask. Or, for the process of manufacture of a semiconductor device of the first embodiment in the present invention, a pattern may be formed by directly plotting the layout data on a substrate by processing equipment of electronic beam or the like. The pattern is usually formed by a photopolymer film of photoresist and the like, and by exposure through a photomask, or processing equipment such as an electron beam, the layout data is plotted directly onto the substrate. Using this pattern, for example, by partial ion implant into the source and drain formation area of the semiconductor substrate an impurity diffused layer is formed. Also, the wire formation process, a metal wiring layer made of polysilicon, tungsten or the like is formed before and after the process that performs the pattern transfer or a processing using an electronic beam or the like. A desired metal wiring layer is obtained by processing the wiring layer in a process that performs the pattern transfer or in a process that uses an electronic beam or the like. Usually, a plurality of such metal wiring layers are formed while repeating the foregoing processes. Insulating films are usually provided between each of these metal wiring layers. In addition, the wiring layers on both sides that sandwich an insulating film obtain inter-electric connection between each of the metal wiring layers by forming interconnected conductors at desired places in the insulating films. The pattern can be formed on a substrate, based on a reliability-improved layout data by the foregoing processes of manufacture. In addition, a semiconductor integrated circuit containing various fine semiconductor devices and the like that are incorporated inside the semiconductor devices can be formed in high accuracy. Therefore, the process of manufacture of a semiconductor device allows the reliability and yield of a semiconductor device to be improved.

Second Embodiment

In the first embodiment above-mentioned, it is designed to calculate a change in potential at the terminal N2 to which the added P channel-type transistor or N channel-type transistor is connected and to judge whether the terminal N2 is of a true floating error or a pseudo floating error. In the second embodiment, changes in potential between the added P channel-type transistor and N channel-type and the terminal N2 are calculated to judge whether the terminal N2 is of a true floating error or a pseudo floating error.

The descriptions of FIG. 1A, FIG. 1B and FIG. 1C which are the block diagrams showing the composition examples of the verification equipment of a semiconductor integrated circuit of the second embodiment in the present invention are the same as in the first embodiment.

Figure 15:
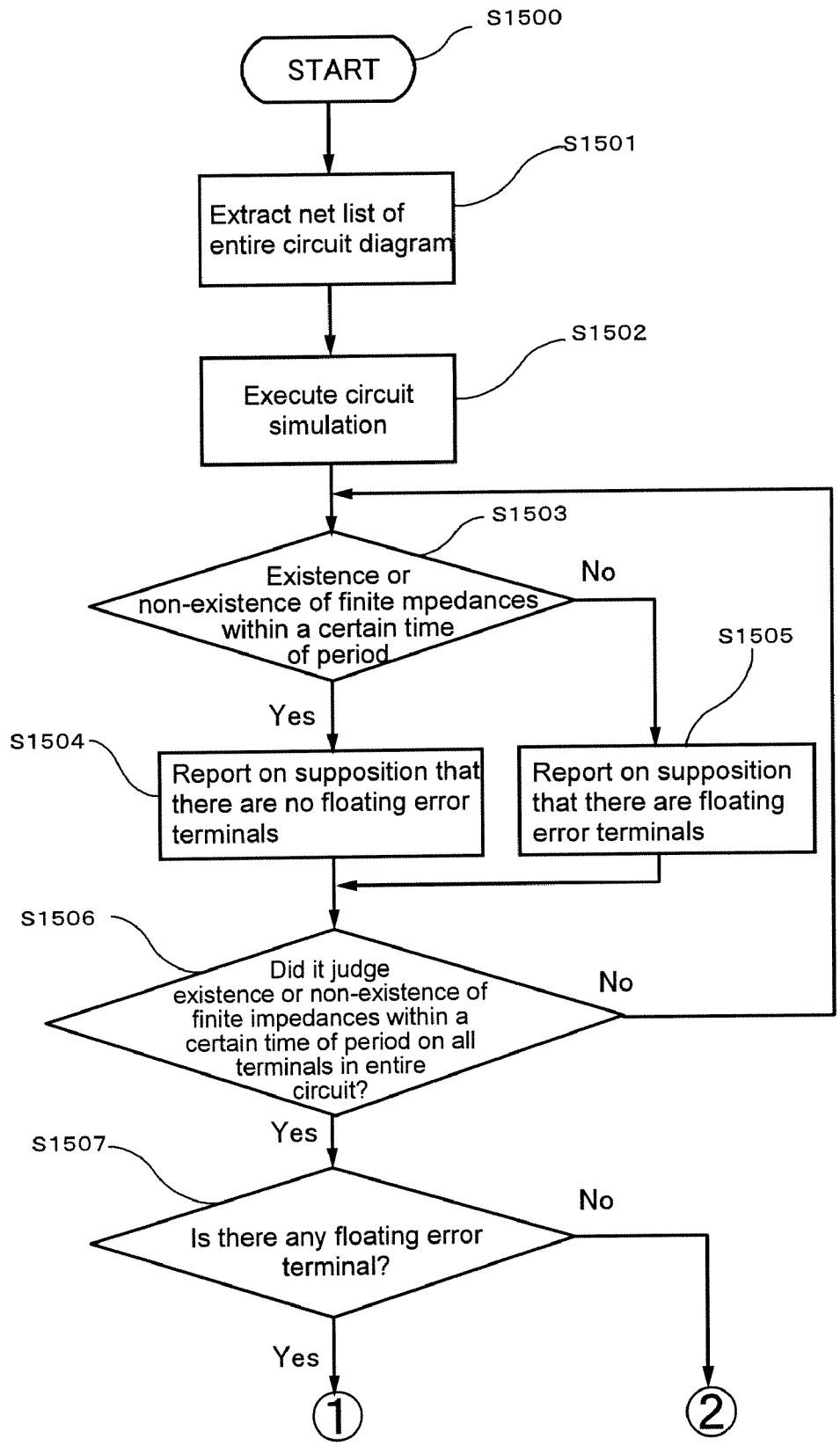
FIG. 15 is a flowchart showing one example of processing of a verification method of a second embodiment of verification equipment of a semiconductor integrated circuit in the present invention.
Figure 16:
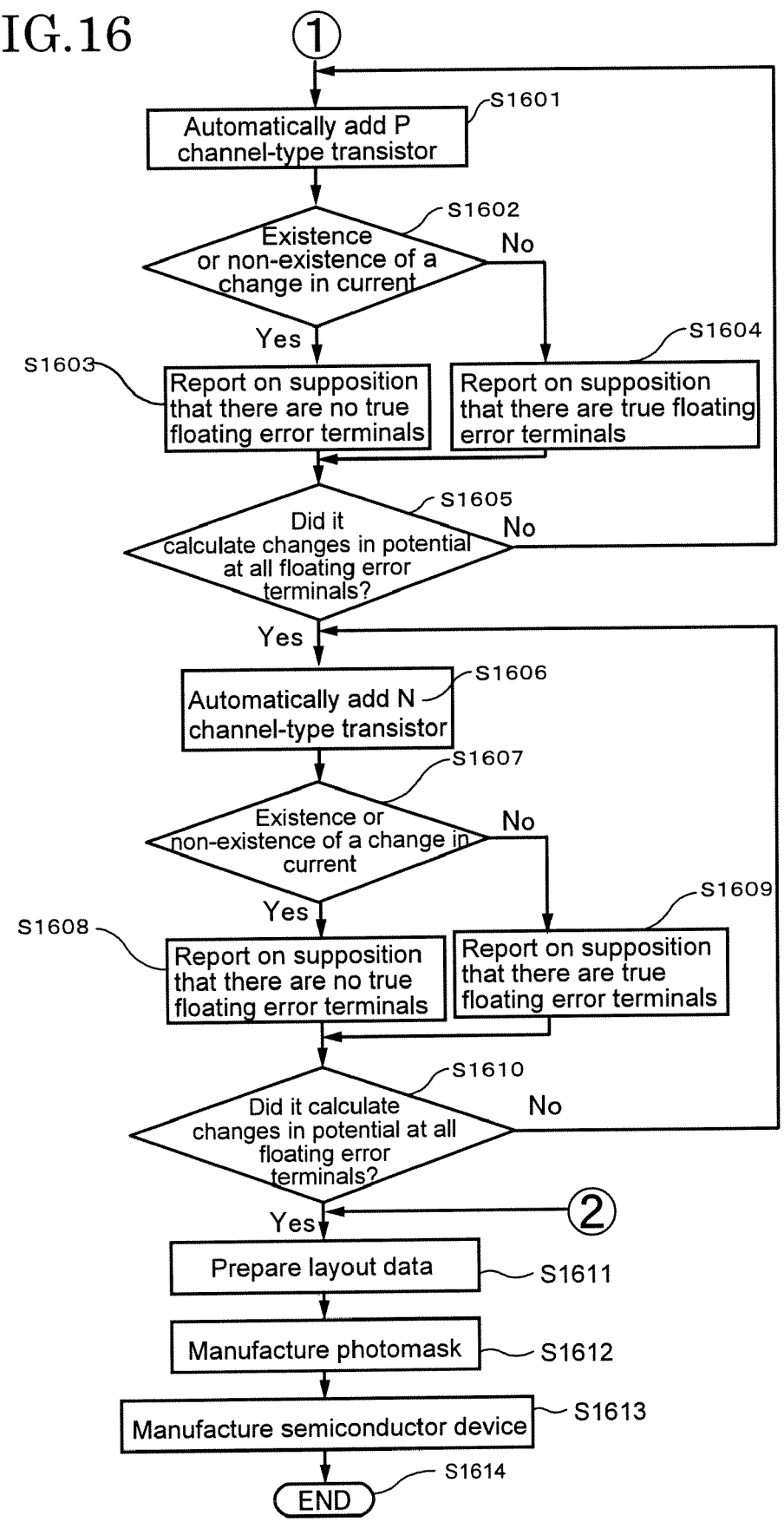
FIG. 16 is a flowchart showing one example of processing of a verification method of the second embodiment of verification equipment of a semiconductor integrated circuit in the present invention.

In addition, FIG. 15 and FIG. 16 are the flowcharts each showing one example of processing of a method of verifying a semiconductor integrated circuit of the second embodiment in the present invention.

In addition, in the second embodiment also, the descriptions are made using FIG. 2, FIG. 5 and FIG. 8.

The operations of the second embodiment and the first embodiment are the same, except for only the operations of step S1602 to step 1604 of the second embedment, step S802 to step 804 of the first embodiment, step 1607 to step 1609 of the second embodiment, and step S807 and step S809 of the first embodiment. Therefore, the operations of step S1602 to step 1604 and step S1607 to step S1609 are described below.

First, the operations of step S1602 to step S1604 are described.

Figure 17:
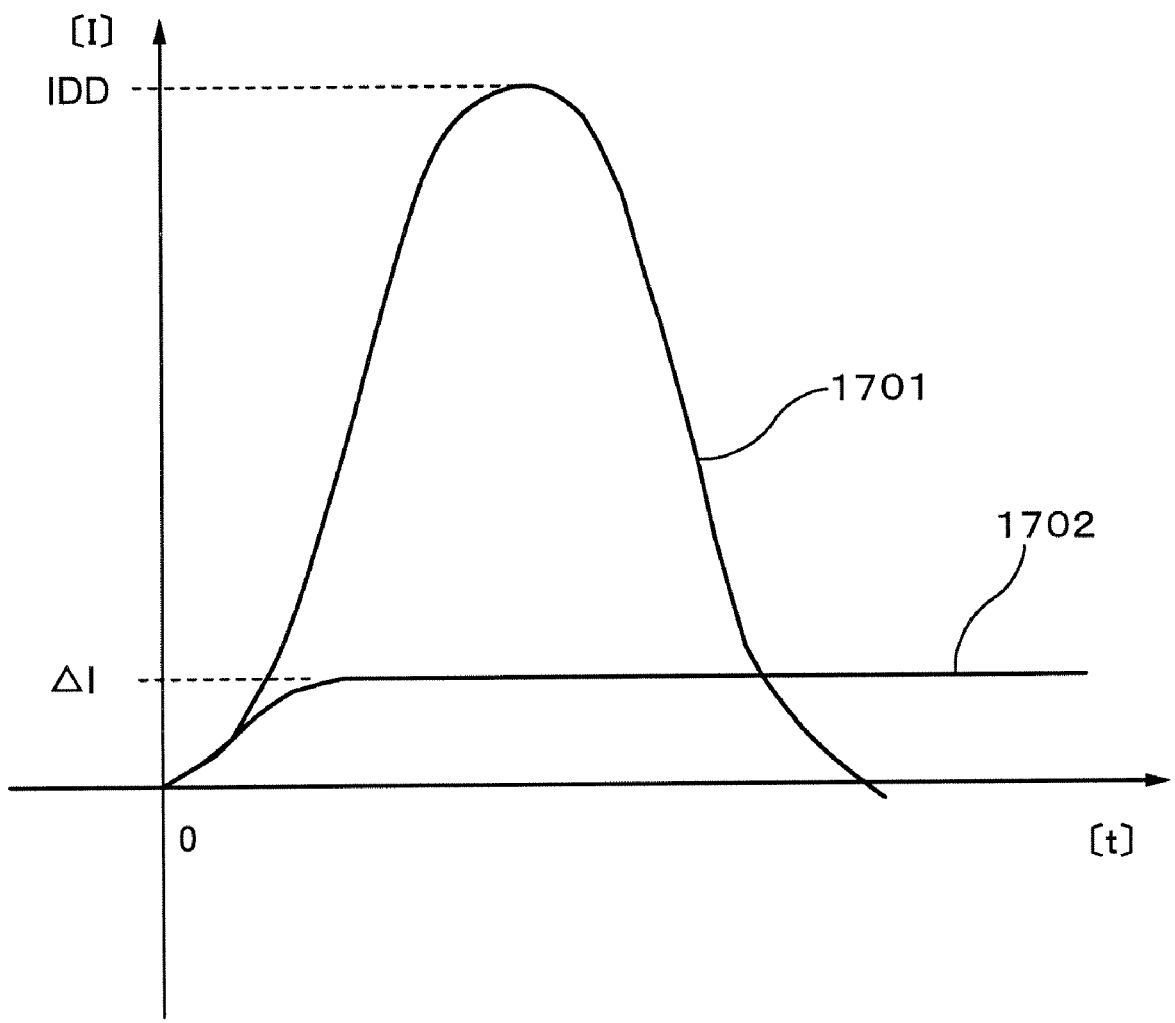
FIG. 17 is a diagram showing a calculated example of a change in current at a terminal in case a P channel-type transistor is connected to a floating error terminal of the second embodiment of verification equipment of a semiconductor integrated circuit in the present invention.

In step S1602, when the terminal N2 is a floating error terminal, if a change of the current flowing between the terminal N2 and the P channel-type transistor 901 is measured, after the current flowing between the terminal N2 and the P channel-type transistor 901 once rises to the maximum current IDD, it then lowers, as shown in the characteristic curve 1701 in FIG. 17. If such a change of current is calculated (step S1602: No), the true floating error terminal judgment section 505 judges that the terminal N2 is a true floating error terminal and gives the judgment result to the output section 506 (step S1604).

On the other hand, in step S1602, when the terminal N2 is not a floating error terminal, if a change in current at the terminal N2 is measured, the current at the terminal N2 does not vary over a constant value as shown in the characteristic curve 1702 in FIG. 17. If such a change in current is calculated (step S1602: Yes), the true floating error terminal judgment section 505 judges that the terminal N2 is not a floating error terminal and gives the judgment result to the output section 506 (step 1603).

Next, the operations of step S1607 to step S1609 are described.

Figure 18:
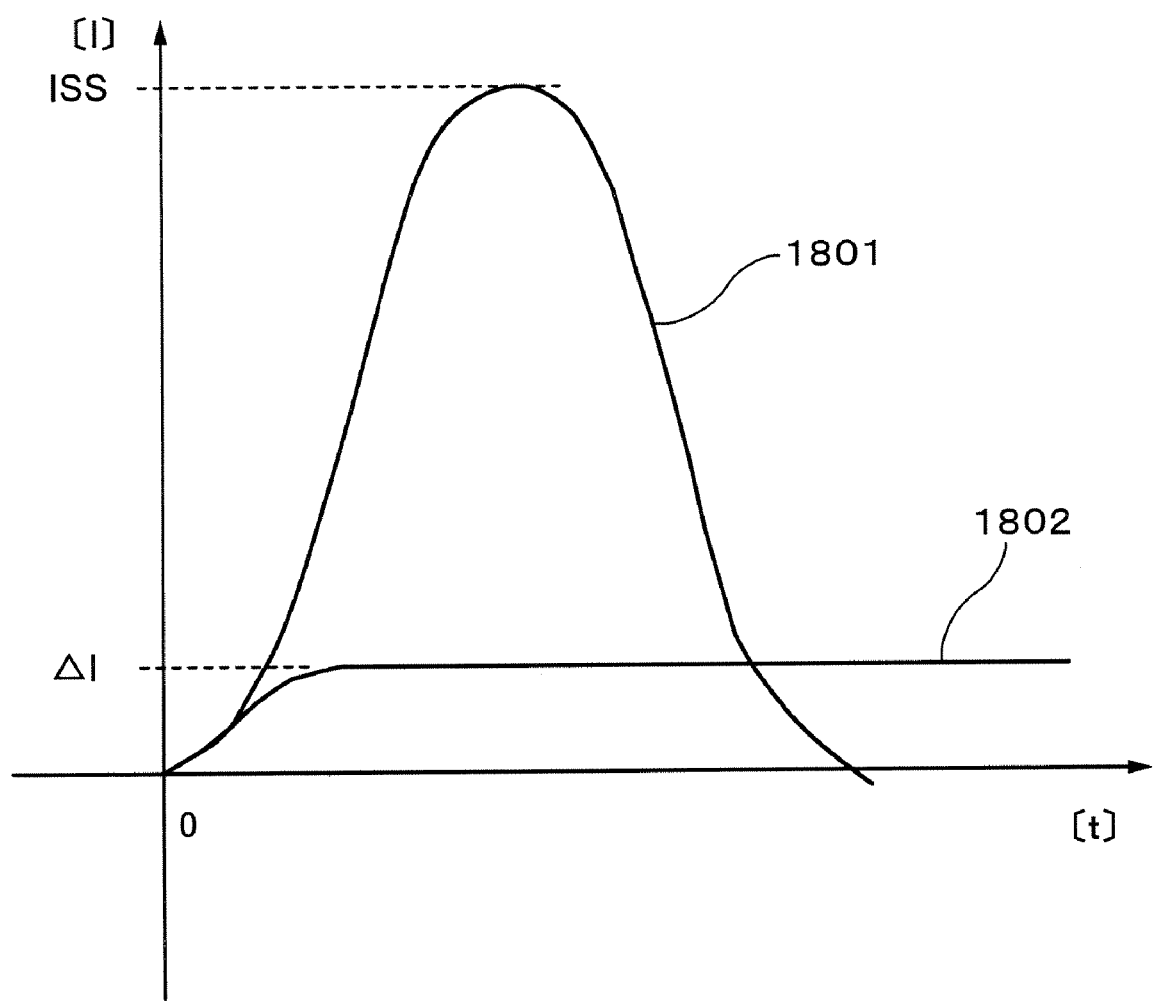
FIG. 18 is a diagram showing a change in current at a terminal in case an N channel-type transistor is connected to a floating error terminal of the second embodiment of verification equipment of a semiconductor integrated circuit in the present invention.

In step S1607, when the terminal N2 is a floating error terminal, if a change of the current flowing between the terminal N2 and the N channel-type transistor 1201 is measured, after the current flowing between the terminal N2 and the N channel-type transistor 1201 once rises to the maximum current ISS, it then lowers, as shown in the characteristic curve 1801 in FIG. 18. Such a change in current is calculated (step S1607: No), the true floating error terminal judgment section 505 judges that the terminal N2 is a floating error terminal and gives the judgment result to the output section 506 (step S1609).

On the other hand, in step S1607, when the terminal N2 is not a floating error terminal, if a change in current at the terminal N2 is measured, the current at the terminal N2 does not vary over a constant value as shown in the characteristic curve 1802 in FIG. 18. If such a change in current is calculated (step S1607: Yes), the true floating error terminal judgment section 505 judges that the terminal N2 is not a floating error terminal and gives the judgment result to the output section 506 (step S1608).

Thus, according to the verification equipment of a semiconductor integrated circuit of the second embodiment in the present invention, it is possible to remove pseudo floating error terminals out of the floating error data detected in analyzing the floating error terminals in the semiconductor integrated circuit and automatically detect true floating error terminals only.

Third Embodiment

The verification equipment of a semiconductor integrated circuit of the third embodiment in the present invention is an example that performs the following processings on all the floating error terminals one by one such that after the verification equipment calculates a change in potential at the terminal N2 in case a P channel-type transistor is added to a floating error terminal and the P channel-type transistor is connected thereto, it calculates a change in potential at the terminal N2 in case an N-channel-type transistor is added and the N channel-type transistor is connected thereto, and judges whether a terminal judged to be of a floating error is a true floating error or a pseudo floating error, based on the results of the calculation.

The descriptions of FIG. 1A, FIG. 1B, and FIG. 1C which are the block diagrams showing the composition examples of the verification equipment of a semiconductor integrated circuit of the third embodiment in the present invention are the same as in the third embodiment, the first embodiment and the second embodiment.

Figure 19:
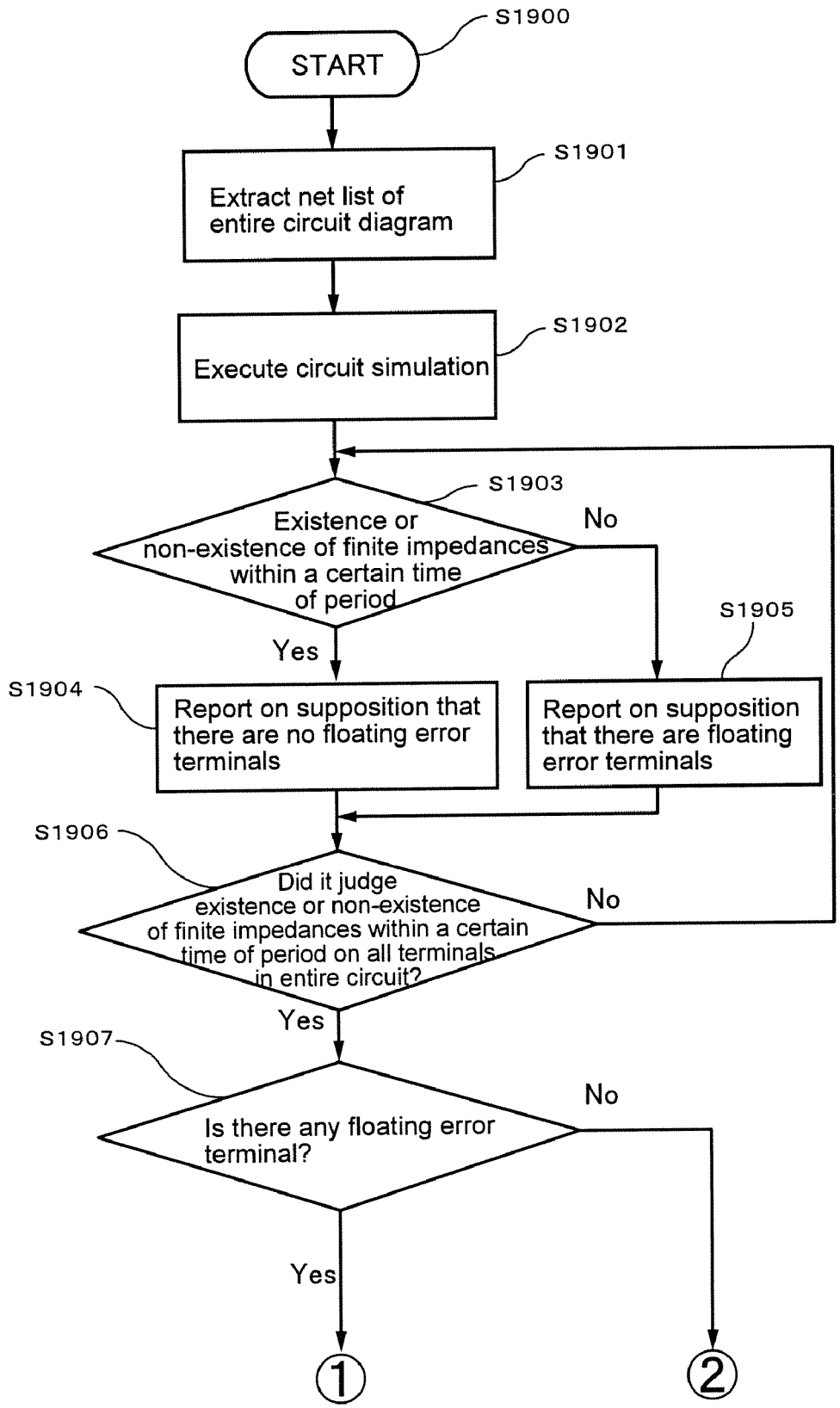
FIG. 19 is a flowchart showing one example of processing of a verification method of a third embodiment of verification equipment of a semiconductor integrated circuit in the present invention.
Figure 20:
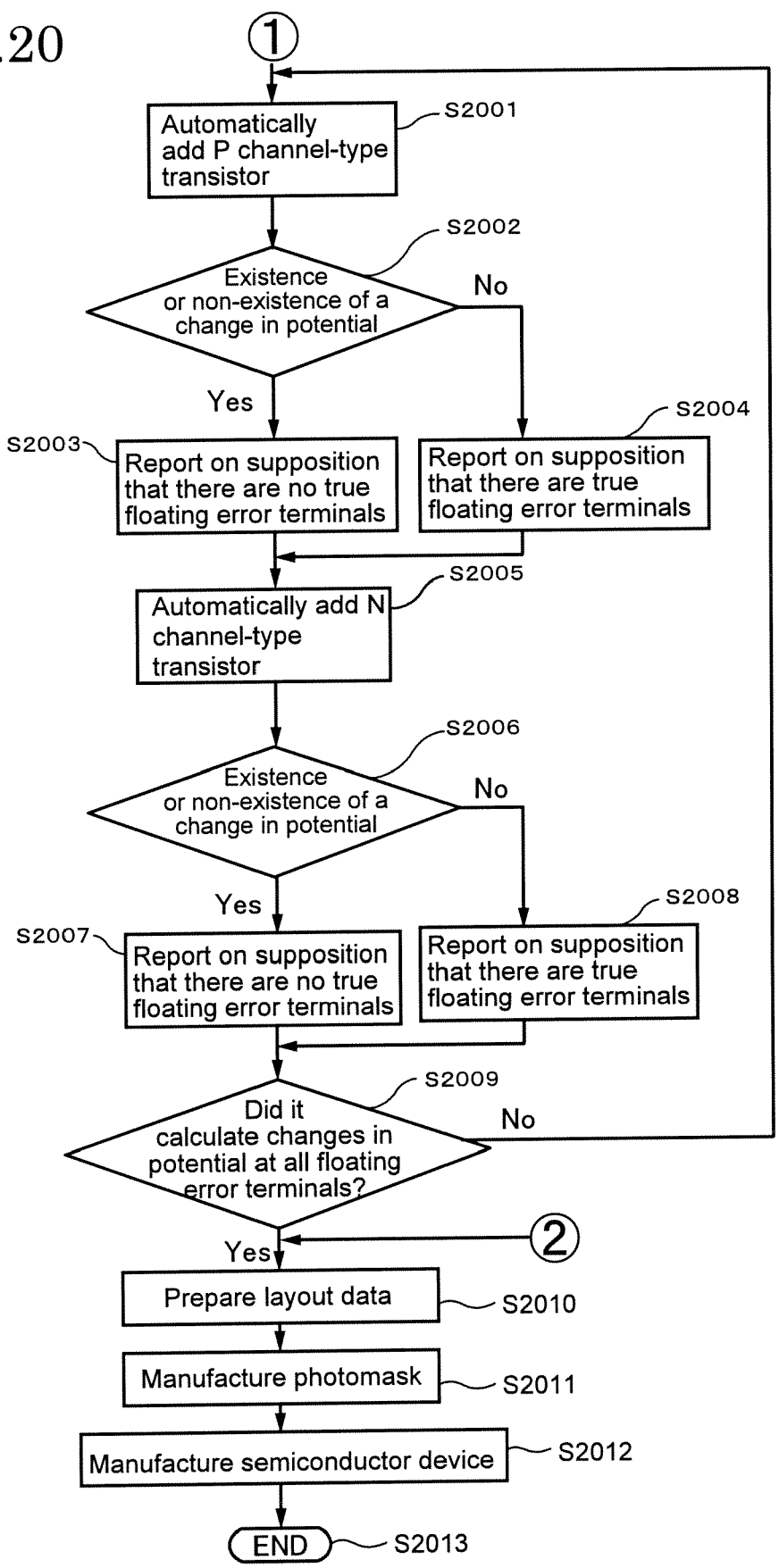
FIG. 20 is a flowchart showing one example of processing of a verification method of the third embodiment of verification equipment of a semiconductor integrated circuit in the present invention.

FIG. 19 and FIG. 20 are each the flowcharts showing one example of processing of the method of verifying a semiconductor integrated circuit of the third embodiment in the present invention.

In the third embodiment also, the descriptions are made by using FIG. 2, FIG. 5 to FIG. 10.

As the operations of step S1900 to step S1907 of the third embodiment, step S700 to step S707 of the first embodiment, and step 1500 to step 1507 of the second embodiment are the same in the third embodiment, the first embodiment, and the second embodiment, the operations after step S2001 are described below.

In step S1907, if it is judged that there are floating error terminals in a specific circuit, the true floating error terminal judgment section 505 adds the P channel-type transistor 901 where a source or drain is connected to the terminal N2 as shown in FIG. 5 to the terminal N2 that are judged to be of a floating error (step S2001) and calculates a change in potential at the terminal N2 within a predetermined time of period at the terminal N2 (step 2002). In addition, the channel width of the P channel-type transistor 901 is smaller than those of the transistors Tr3 and Tr4 used for the circuit to which the terminal N1 is connected. The channel width of P channel-type transistor 901 may be also ¹⁄₁₀₀ times or more and ¹⁄₁₀ times or less those of the transistors Tr3 and Tr4 used for the circuit to which the terminal N2 is connected.

Here, in step S2002, a potential IN (for example, VDD->VSS) as shown in FIG. 6 is applied to a gate of the P channel-type transistor 901 to drive the P channel-type transistor 901. In addition, here, applying the potential IN (for example, VDD->VSS) to the P channel-type transistor 901 is to prevent spike current from flowing in the P channel-type transistor 901. In addition, in the third embodiment, the potential IN (for example, VDD->VSS) as shown in FIG. 6 is applied to the gate of the P channel-type transistor 901 to drive the P channel-type transistor 901. In addition, in the verification equipment of a semiconductor integrated circuit of the third embodiment in the present invention, the application of a potential is not limited to such a method of applying the potential, and an arbitrary potential may be applied to drive the P channel-type transistor 901.

In step S2002, when the terminal N2 is a true floating error terminal, if a change in potential at the terminal N2 in FIG. 5 to which the P channel-type transistor 901 is added is calculated, it is as shown in the characteristic curve 1101 in FIG. 7. Namely, although a potential of the terminal N2 is initially in uncertain condition, if a gate potential of the P channel-type transistor 901 is sequentially being turned ON, as a certain time of period lapses, the potential of the terminal N2 rises from GND to VDD as shown in the characteristic curve 1101. If such a change in potential is calculated (step 2002: No), the true floating error terminal judgment section 505 judges that the terminal N2 is a true floating error terminal and gives the judgment result to the output section 506 (step S2004).

On the other hand, in step S2002, if the terminal N2 is not a floating error terminal, there is inevitable path to a fixed potential. Because the channel width of the P channel-type transistor 901 is smaller than those of the transistors Tr3 and Tr4 used for the circuit to which the terminal N2 is connected, the capacity for driving the P channel-type transistor 901 is insufficient and the current scarcely flows in the P channel-type transistor 901, a potential of the terminal N2 does not vary over a constant value as shown in the characteristic curve 1102 in FIG. 7. If such a change in potential is calculated (step S2002: Yes), the true floating error terminal judgment section 505 judges that the terminal N2 is not a true floating error terminal and gives the judgment result to the output section 506 (step S2003).

Next, in step S2001, the true floating error terminal judgment section 505 adds the N channel-type transistor 1201 where a source or drain is connected to the terminal N2 as shown in FIG. 8 to which the P channel-type transistor 901 is added (step S2005) and calculates a change in potential at the terminal N2 within a predetermined time of period at the terminal N2 (step S2006). In addition, the channel width of the N channel-type transistor 1201 is smaller than those of the transistors Tr3 and Tr4 used for the circuit to which the terminal N2 is connected. The channel width of the N channel-type transistor 1201 may be also 1/100 times or more and 1/10 times or less those of the transistors Tr3 and Tr4 used for the circuit to which the terminal N2 is connected.

Here, in step S2006, the potential IN (for example, GND->VDD) as shown in FIG. 9 is applied to the gate of the N channel-type transistor 1201 to drive the N channel-type transistor 1201. In addition, here, applying the potential IN (for example, GND->VDD) to the N channel-type transistor 1201 is to prevent spike current from flowing in the N channel-type transistor 1201. In addition, in the third embodiment, the potential IN as shown in FIG. 9 is applied to the N channel-type transistor 1201 to drive the N channel-type transistor 1201. In addition, in the verification equipment of a semiconductor integrated circuit of the third embodiment in the present invention, the application of a potential is not limited to such a method of applying the potential, and an arbitrary potential may be applied to drive the N channel-type transistor 1201.

Figure 10:
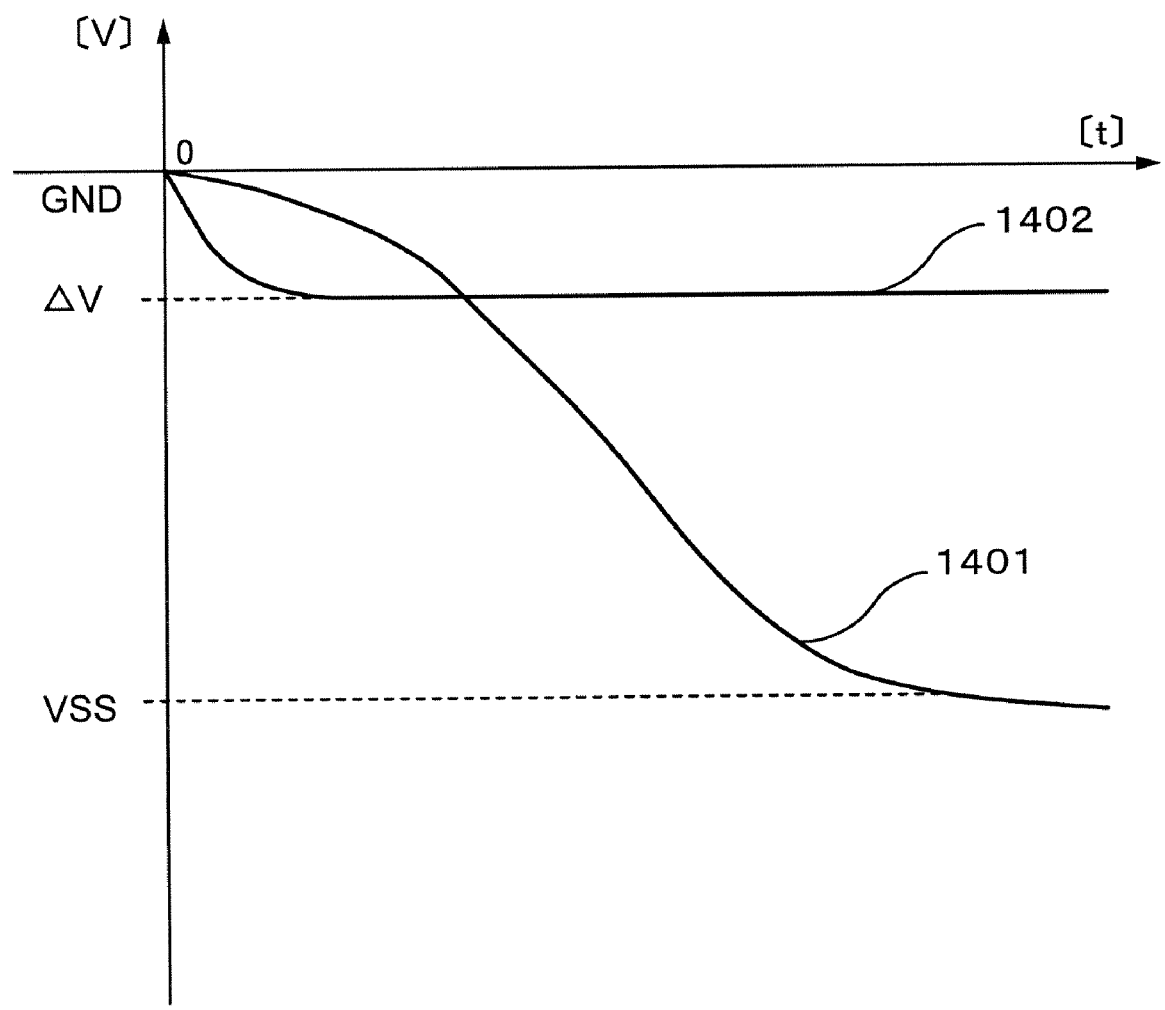
FIG. 10 is a diagram showing a change in a potential at a terminal in case an N channel-type transistor is connected to a floating error terminal of the first embodiment of verification equipment of a semiconductor integrated circuit in the present invention.

In step S2006, when the terminal N2 is a true floating error terminal, if a change in potential at the terminal N2 in FIG. 8 to which the N channel-type transistor 1201 is added is calculated, it is as shown in the characteristic curve 1401 in FIG. 10. Namely, although the potential of the terminal N2 is initially in uncertain condition, the gate potential of the N channel-type transistor 1201 is sequentially being turned ON, as a certain time of period lapses, the potential of the terminal N2 lowers from GND to VSS as shown as shown in the characteristic curve 1401. If such a change in potential at the terminal is calculated (step S2006: No), the true floating error terminal judgment section 505 judges that the terminal N2 is a true floating error terminal and gives the judgment result to the output section 506 (step S2008).

On the other hand, in step S2006, if the terminal N2 is not a floating error terminal, there is inevitably path to a fixed potential. Because the channel width of the N channel-type transistor 1201 is smaller than those of the transistors Tr3 and Tr4 used for the circuit to which the terminal N2 is connected and the capacity for driving the N channel-type transistor 1201 is insufficient, the current scarcely flows in the N channel-type transistor 1201, the potential of the terminal N2 does not vary over a constant value as shown in the characteristic curve 1402 in FIG. 10. If such a change in potential is calculated (step S2006: Yes), the true floating error terminal judgment section 505 judges that the terminal N2 is not a true floating error terminal and gives the judgment result to the output section 506 (step S2007).

Next, the true floating error terminal judgment section 505 judges whether or not the P channel-type transistor 901 and the N channel-type transistor 1201 are added to all the terminals that are judged to be of a floating error in step S1907 and changes in potential at the terminals are calculated (step S2009). If the true floating error terminal judgment section 505 judges that the P channel-type transistor 901 and the N channel-type transistor 1201 are added to all the terminals and changes in potential at the terminals are calculated (step 2009: Yes), the method of verifying a semiconductor integrated circuit of the third embodiment in the present invention is finished and it advances to a layout data preparation processing in step S2010.

On the other hand, if the true floating error terminal judgment section 505 judges that the P channel-type transistor 901 and the N channel-type transistor 1201 are added to all the terminals that are judged to be of a floating error in step S1907 and changes in potential at the terminals are not calculated (step S2009: No), the true floating error terminal judgment section 505 performs the verifying methods in the step S2001 to step S2008 on other terminals that are judged to be of a floating error (step S2009).

Thus, according to the verification equipment of a semiconductor integrated circuit of the third embodiment in the present invention, it is possible to remove pseudo floating error terminals out of a floating error data detected in analyzing floating error terminals in a semiconductor integrated circuit and automatically detect true floating error terminals only.

Fourth Embodiment

In the third embodiment above-mentioned, it is designed to calculate a change in potential at the terminal N2 to which the P channel-type transistor is added and the N channel-type transistor is connected and judge whether the terminal N2 is a true floating error or a pseudo floating error. However, in the fourth embodiment, it calculates changes in current between the P channel-type transistor and the N channel-type transistor and the terminal N2 and judges whether the terminal N2 is a true floating error or a pseudo floating error.

The descriptions of FIG. 1A, FIG. 1B, and FIG. 1C which are the block diagrams showing the composition examples of the verification equipment of a semiconductor integrated circuit of the fourth embodiment in the present invention are the same as the first embodiment to the third embodiment.

Figure 21:
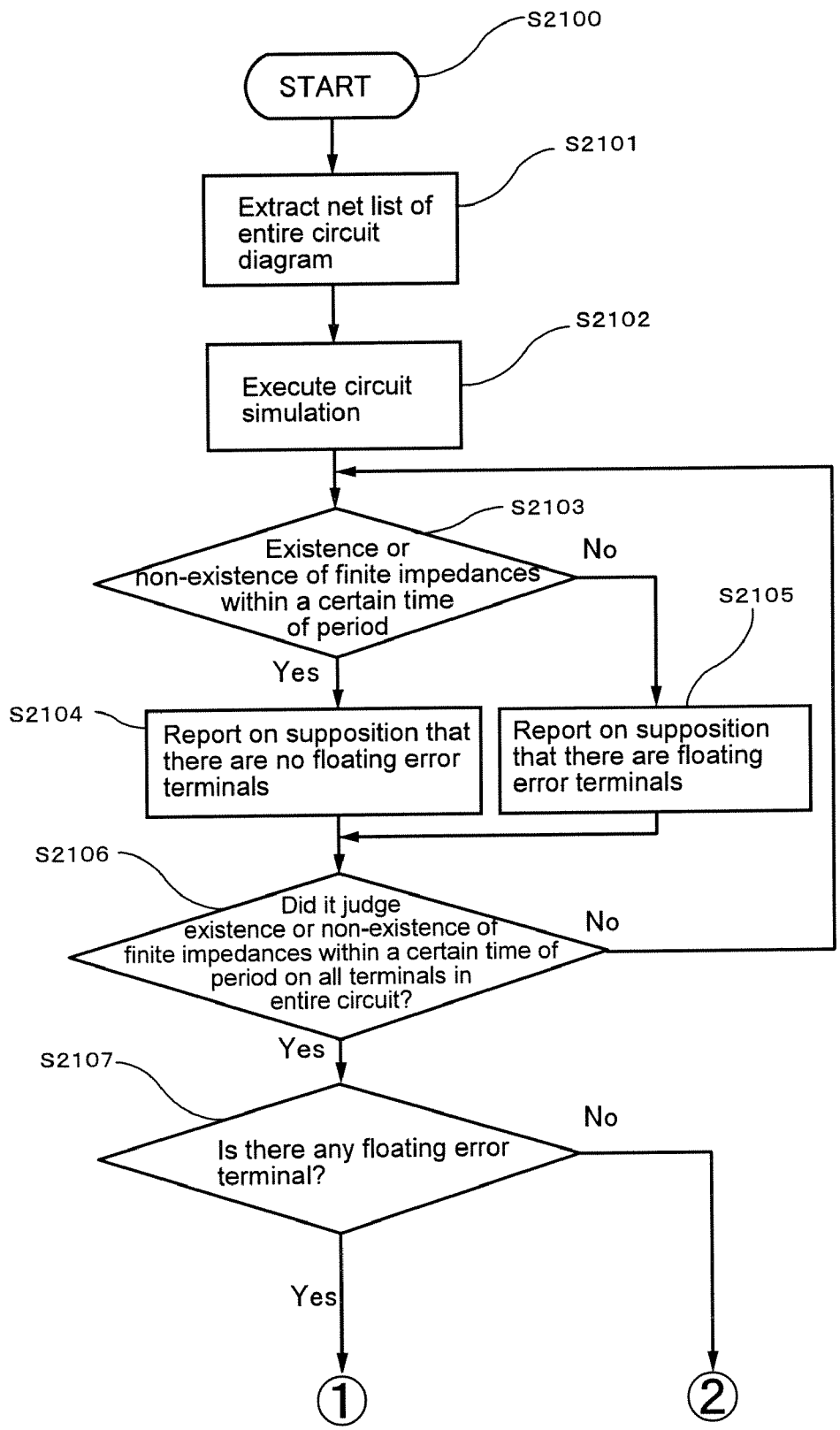
FIG. 21 is a flowchart showing one example of processing of a verification method of a fourth embodiment of verification equipment of a semiconductor integrated circuit in the present invention.
Figure 22:
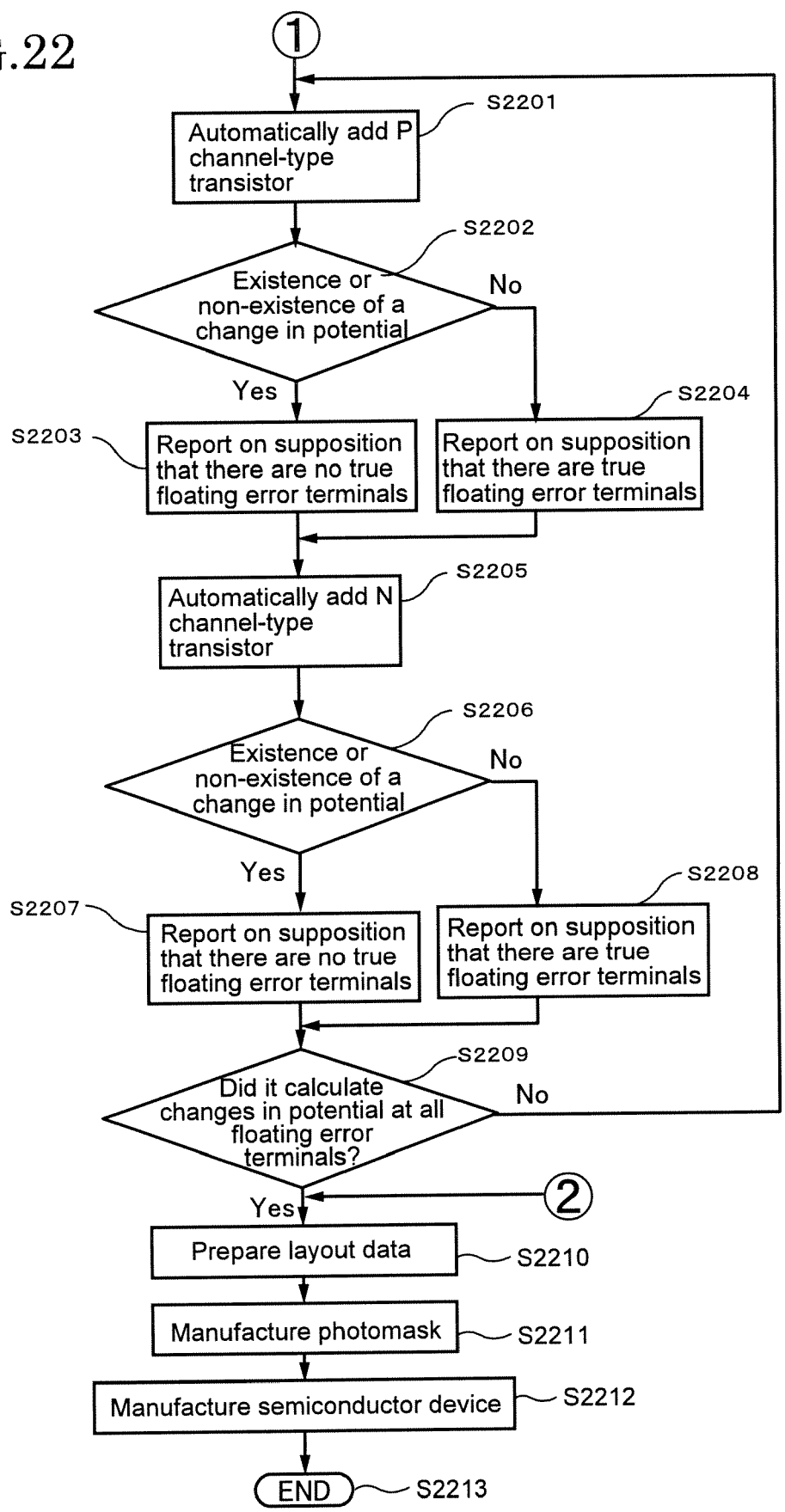
FIG. 22 is a flowchart showing one example of processing of a verification method of the fourth embodiment of verification equipment of a semiconductor integrated circuit in the present invention.

In addition, FIG. 21 and FIG. 22 are the flowcharts showing one example of processing of the method of verifying a semiconductor integrated circuit of the fourth embodiment in the present invention.

In addition, in the fourth embodiment also, the descriptions are made by using FIG. 2, FIG. 5, FIG. 8, FIG. 17 and FIG. 18.

In the fourth embodiment and the third embodiment, only the operations of step S2202 to S2204 of the fourth embodiment, step S2002 to step S2004 of the third embodiment, step S2206 to step 2209 of the fourth embodiment, and step S2006 to step S2009 of the third embodiment are different, and the other operations are the same. Therefore, the operations of step S2202 to step S2204 and step S2206 to step S2209 are described below.

First, the operations of step S2202 to step S2204 are described.

In step S2202, when the terminal N2 is a floating error terminal, if a change of current flowing between the terminal N2 and the P channel-type transistor 901 is measured, after the current flowing between the terminal N2 and the P channel-type transistor 901 once rises to the maximum current IDD, it then lowers as shown in the characteristic curve 1701 in FIG. 17. If such a change in current is calculated, the true floating error terminal judgment section 505 judges that the terminal N2 is a true floating error terminal and gives the judgment result to the output section 506 (step S2204).

On the other hand, in step S2202, when the terminal N2 is not a true floating error terminal, if a change in current at the terminal N2 is measured, the current of the terminal N2 does not vary over a constant value as shown in the characteristic curve 1702 in FIG. 17. If such a change in current is calculated, the true floating error terminal judgment section 505 judges that the terminal N2 is not a floating error terminal and gives the judgment result to the output section 506 (step S2203).

Next, the operations of step S2206 to step S2209 are described.

In step 2206, when the terminal N2 is a floating error terminal, if a change of the current flowing between the terminal N2 and the N channel-type transistor 1201 is measured, after the current flowing between the terminal N2 and the N channel-type transistor 1201 once rises to the maximum ISS, it then lowers as shown in the characteristic curve 1801 in FIG. 18. If such a change in current is calculated (step S2206: No), the true floating error terminal judgment section 505 judges that the terminal N2 is a floating error terminal and gives the judgment result to the output section 506 (step S2208).

On the other hand, in step S2206, when the terminal N2 is not a floating error terminal, if a change in current at the terminal N2 is measured, the current of the terminal N2 does not vary over a constant value as shown in the characteristic curve 1802 in FIG. 18. If such a change in current is calculated (step S2206: Yes), the true floating error terminal judgment section 505 judges that the terminal N2 is not a floating error terminal and gives the judgment result to the output section 506 (step S2207).

Thus, according to the verification equipment of a semiconductor integrated circuit of the fourth embodiment in the present invention, it is possible to remove pseudo floating error terminals out of a floating error data detected in analyzing floating error terminals in a semiconductor integrated circuit and automatically detect true floating error terminals only.

In addition, as one embodiment in the present invention, the verification equipment of a semiconductor integrated circuit having the circuit net list extraction section that extracts the net list of a circuit connected to fixed potentials, the circuit simulation execution section that executes a circuit simulation, based on the extracted net list, the floating error terminal judgment section that judges the existence or nonexistence of floating error terminals by measuring the existence or nonexistence of finite impedances, the true floating error terminal judgment section that adds any one of the P channel-type transistor and the N channel-type transistor is added to terminals in a first circuit and calculates changes in potential at the terminals in the first circuit where there are floating error terminals out of all the terminals that are judged by the floating error judgment section, and adds the other of the P channel-type transistor and the N channel-type transistor to the terminals and calculates changes in potentials at the terminals, and the output section that outputs the judgment results of the floating error terminal judgment section and the judgment results of the true floating error terminal judgment section is provided. This allows pseudo floating error terminals to be removed and true floating error terminals only to be automatically detected out of a floating error data detected in analyzing floating error terminals in a semiconductor integrated circuit.

In addition, as one embodiment in the present invention, the verification equipment of a semiconductor integrated circuit having the circuit net list extraction section that extracts the net list of a circuit connected to fixed potentials, the circuit simulation execution section that executes a circuit simulation, based on the extracted net list, the finite impedance judgment section that judges the existence or nonexistence of finite impedances in the circuit, the floating error terminal judgment section that judges the existence or nonexistence of floating error terminals by measuring the existence or nonexistence of finite impedances, the true floating error terminal judgment section that adds any one of the P channel-type transistor and the N channel-type transistor to the terminals of the circuit where there are floating error terminals that are judged by the floating error terminal judgment section and calculates changes in potentials at the terminals, and adds the other of the P channel-type transistor and the N channel-type transistor to the terminals and calculates changes in potentials at the terminals, and the output section that outputs the judgment results of the floating error terminal judgment section and the judgment results of the true floating error terminal judgment section is provided. This allows pseudo floating error terminals to be removed and true floating error terminals only to be automatically detected out of a floating error data detected in analyzing floating error terminals in a semiconductor integrated circuit.

In addition, as one embodiment in the present invention, the verification equipment of a semiconductor integrated circuit having the circuit net list extraction section that extracts the net list of a circuit connected to fixed potentials, the circuit simulation execution section that executes a circuit simulation, based on the extracted net list, the finite impedance judgment section that judges the existence or nonexistence of finite impedances in the circuit, the floating error terminal judgment section that judges the existence or nonexistence of floating error terminals by measuring the existence or nonexistence of finite impedances, the true floating error terminal judgment section that adds any one of the P channel-type transistor and the N channel-type transistor to terminals in a first circuit and calculates changes in potential at the terminals in the first circuit where there are floating error terminals out of all the terminals that are judged by the floating error judgment section, and adds the other of the P channel-type transistor and the N channel-type transistor to the terminals and calculates changes in potentials at the terminals, and the output section that outputs the judgment results of the floating error terminal judgment section and the judgment results of the true floating error terminal judgment section is provided. This allows pseudo floating error terminals to be removed and true floating error terminals only to be automatically detected out of a floating error data detected in analyzing floating error terminals in a semiconductor integrated circuit.

In addition, as one embodiment in the present invention, the method of verifying a semiconductor integrated circuit, wherein the net list of a circuit is extracted, the existence or nonexistence of finite impedances is judged, based on the extracted net list, if it is judged that there are not finite impedances in the circuit, any one of the P channel-type transistor and the N channel-type transistor is added to terminals of the circuit and changes in potential at the terminals are calculated and the other of the P channel-type transistor and the N channel-type transistor is added to the terminals and changes in potential at the terminals are calculated is provided. This allows pseudo floating error terminals to be removed and true floating error terminals only to be automatically detected out of a floating error data detected in analyzing floating error terminals in a semiconductor integrated circuit.

In addition, as one embodiment in the present invention, the method of verifying a semiconductor integrated circuit, wherein the net list of a circuit is extracted, after the existence or nonexistence of finite impedances is judged, based on the extracted net list, any one of the P channel-type transistor and the N channel-type transistor is added to terminals to a first circuit and changes in potentials at the terminals are calculated in the first circuit where it is judged that there are not finite impedances in the entire circuit, and the other of the P channel-type transistor and the N channel-type transistor and changes in potentials at the terminals are calculated is provided. This allows pseudo floating error terminals to be removed and true floating error terminals only to be automatically detected out of a floating error data detected in analyzing floating error terminals in a semiconductor integrated circuit.

In addition, as one embodiment in the present invention, the method of verifying a semiconductor integrated circuit, wherein it is judged that a wiring connected to the terminal is floating if the potential of a terminal varies over a constant value is provided. This allows pseudo floating error terminals to be removed and true floating error terminals only to be automatically detected out of a floating error data detected in analyzing floating error terminals in a semiconductor integrated circuit.

In addition, as one embodiment in the present invention, the method of verifying a semiconductor integrated circuit, wherein the net list of a circuit connected to fixed potentials is extracted, the existence or nonexistence of finite impedances in the circuit is judged, based on the extracted net list, if it is judged that there are not finite impedances in the circuit, any one of the P channel-type transistor and the N channel-type transistor is added to the terminals and changes in the current flowing in the P channel-type transistor or the N channel-type transistor is calculated, and the other of the P channel-type transistor and the N channel-type transistor is added to the terminals and changes in the current flowing in the P channel-type transistor or the N channel-type transistor is calculated is provided. This allows pseudo floating error terminals to be removed and true floating error terminals only to be automatically detected out of a floating error data detected in analyzing floating error terminals in a semiconductor integrated circuit.

In addition, as one embodiment in the present invention, the method of verifying a semiconductor integrated circuit, wherein the net list of a circuit connected to fixed potentials is extracted, after the existence or nonexistence of finite impedances in the entire circuit is judged, based on the extracted net list, any one of the P channel-type transistor and the N channel-type transistor is added to the terminal of the first circuit and changes in the current flowing in the P channel-type transistor or the N channel-type transistor is calculated, and the other of the P channel-type transistor and the N channel-type transistor is added to the terminal and a change in the current flowing in the P channel-type transistor or the N channel-type transistor is calculated in the first circuit where it is judged that there are not finite impedances in the entire circuit is provided. This allows pseudo floating error terminals to be removed and true floating error terminals only to be automatically detected out of a floating error data detected in analyzing floating error terminals in a semiconductor integrated circuit.

In addition, as one embodiment in the present invention, the method of verifying a semiconductor integrated circuit, wherein it is judged that the wiring connected to a terminal is floating, if the current flowing in the P channel-type or the N channel-type transistor varies over a constant value is provided. This allows pseudo floating error terminals to be removed and true floating error terminals only to be automatically detected out of a floating error data detected in analyzing floating error terminals in a semiconductor integrated circuit.

In addition, as one embodiment in the present invention, the method of verifying a semiconductor integrated circuit, wherein a fixed potential is a power supply potential, an earth potential, or internal potentials that are a plurality of internal potentials generated inside a semiconductor integrated circuit. This allows pseudo floating error terminals to be removed and true floating error terminals only to be automatically detected out of a floating error data detected in analyzing floating error terminals in a semiconductor integrated circuit.

In addition, as one embodiment in the present invention, the method of verifying a semiconductor integrated circuit, wherein the channel width of the P channel-type transistor and the N channel-type transistor is $1/100$ times or more and $1/10$ times or less that of a transistor used for a circuit is provided. This allows pseudo floating error terminals to be removed and true floating error terminals only to be automatically detected out of a floating error data detected in analyzing floating error terminals in a semiconductor integrated circuit.

We claim:

1. Verification equipment of a semiconductor integrated circuit comprising:
    a circuit net list extraction section that extracts a net list of a circuit;
    a circuit simulation execution section that executes a circuit simulation, based on the extracted net list;
    a finite impedance judgment section that judges the existence or nonexistence of finite impedances in the circuit;
    a floating error terminal judgment section that judges the existence or nonexistence of floating error terminals by measuring the existence or nonexistence of the finite impedances;
    a true floating error terminal judgment section that adds any one of a P channel-type transistor and an N channel-type transistor to terminals of the circuit where it is judged that there are floating error terminals by the floating error terminal judgment section and calculates changes in potential at the terminals, and adds the other of the P channel-type transistor and the N channel-type transistor to the terminals and calculates changes in potential at the terminals; and
    an output section that outputs a judgment result of the floating error terminal judgment section and a judgment result of the true floating error terminal judgment section.

2. The verification equipment of a semiconductor integrated circuit according to claim 1, wherein the circuit net list extraction section extracts a net list of the circuit connected to fixed potentials from data on a circuit diagram of the semiconductor integrated circuit.

3. The verification equipment of a semiconductor integrated circuit according to claim 1, wherein the simulation execution section executes the circuit simulation on all terminals in the entire circuit of the semiconductor integrated circuit, based on the extracted net list.

4. The verification equipment of a semiconductor integrated circuit according to claim 1, wherein the finite impedance judgment section judges existence or nonexistence of finite impedances within a certain period of time in all terminals in the entire circuit of the semiconductor integrated circuit, based on the net list.

5. The verification equipment of a semiconductor integrated circuit according to claim 4, wherein the floating error terminal judgment section judges existence or nonexistence of the floating error terminals, based on a judgment result of the existence or nonexistence of the finite impedances.

6. The verification equipment of a semiconductor integrated circuit according to claim 1, wherein the true floating error terminal judgment section calculates changes in potential at the terminals within a predetermined period of time.

7. The verification equipment of a semiconductor integrated circuit according to claim 6, wherein the true floating error terminal judgment section judges that a wiring connected to the terminal is floating if a potential of the terminal varies over a constant value.

8. The verification equipment of a semiconductor integrated circuit according to claim 1, wherein the true floating error terminal judgment section judges that a wiring connected to the terminal is floating if a current flowing in the P channel-type transistor or N channel-type transistor varies over a constant value.

9. The verification equipment of a semiconductor integrated circuit according to claim 1, wherein the true floating error terminal judgment section judges that whether the terminal that is judged to be of the floating error is a true floating error terminal or a pseudo floating error terminal, based on a calculation result of a change in potential at the terminal.

10. The verification equipment of a semiconductor integrated circuit according to claim 2, wherein the fixed potential is a power supply potential, an earth potential, or internal potentials that are a plurality of internal potentials generated inside the semiconductor integrated circuit.

11. The verification equipment of a semiconductor integrated circuit according to claim 1, wherein the channel width of the P channel-type transistor and N channel-type transistor is $1/100$ times or more and $1/10$ times or less that of a transistor used for the circuit.

12. A method of verifying a semiconductor integrated circuit comprising:
    extracting a net list of a circuit connected to a fixed potentials from a circuit diagram data of a semiconductor integrated circuit;
    executing a circuit simulation, based on the extracted net list using an electronic design automation (EDA) tool;
    judging existence or nonexistence of finite impedances in the circuit;
    judging existence or nonexistence of floating error terminals by measuring existence or nonexistence of the finite impedances;
    judging existence or nonexistence of true floating error terminals by adding any one of a P channel-type transistor and an N channel-type transistor to terminals of the circuit where it is judged that there are floating error terminals and calculating changes in potential at the terminals, and adding the other of the P channel-type transistor and the N channel-type transistor to the terminals and calculating changes in potential at the terminals; and
    outputting a judgment result of the floating error terminals and a judgment result of the true floating error terminals.

13. The method of verifying a semiconductor integrated circuit according to claim 12, wherein the circuit simulation is executed on all terminals in the entire circuit of the semiconductor integrated circuit, based on the extracted net list in the circuit simulation.

14. The method of verifying a semiconductor integrated circuit according to claim 12, wherein the existence or nonexistence of finite impedances within a certain period of time is judged at all terminals in the entire circuit of the semiconductor integrated circuit, based on the net list in a judgment of the finite impedance.

15. The method of verifying a semiconductor integrated circuit according to claim 12, wherein the existence or nonexistence of said floating error terminals is judged, based on a judgment result of the existence or nonexistence of the finite impedances in a judgment of the floating error terminal.

16. The method of verifying a semiconductor integrated circuit according to claim 12, wherein changes in potential at the terminals are calculated within a predetermined period of time in a judgment of the true floating error terminals.

17. The method of verifying a semiconductor integrated circuit according to claim 16, wherein it is judged that a wiring connected to the terminal is floating if a potential of the terminal varies over a constant value in a judgment of the true floating error terminal.

18. The method of verifying a semiconductor integrated circuit according to claim 12, wherein it is judged that a wiring connected to the terminal is floating if a current flowing in the P channel-type transistor or N channel-type transistor varies over a constant value in a judgment of the true floating error terminal.

19. The method of verifying a semiconductor integrated circuit according to claim 12, wherein it is judged whether the terminal that is judged to be of the floating terminal is a true floating error terminal or a pseudo floating error terminal, based on a calculation result of a change in potential at the terminal calculated in a judgment of the true floating error terminal.

20. A process of manufacture of a semiconductor device comprising:
    extracting a net list of a circuit connected to a fixed potentials from a circuit diagram data of a semiconductor integrated circuit;
    executing a circuit simulation, based on extracted the net list using an electronic design automation (EDA) tool;
    judging existence or nonexistence of finite impedances in the circuit;
    judging existence or nonexistence of floating error terminals by measuring existence or nonexistence of the finite impedances;
    judging existence or nonexistence of true floating error terminals by adding any one of a P channel-type transistor and an N channel-type transistor to terminals of the circuit where it is judged that there are floating error terminals and calculating changes in potential at the terminals, and adding the other of the P channel-type transistor and the N channel-type transistor to the terminals and calculating changes in potential at the terminals;
    outputting a judgment result of the floating error terminals and a judgment result of the true floating error terminals;
    preparing a layout data, based on the data on the circuit diagram of the semiconductor integrated circuit verified;
    manufacturing a photomask having a mask pattern, based on the layout data; and
    manufacturing a semiconductor device by using the photomask.

* * * * *